United States Patent
Kim et al.

(10) Patent No.: US 11,812,604 B2
(45) Date of Patent: Nov. 7, 2023

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Eun Jung Kim, Gyeonggi-do (KR); Hye Won Kim, Hwaseong-si (KR); Sung Yeon Ryu, Chuncheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/182,315

(22) Filed: Feb. 23, 2021

(65) Prior Publication Data
US 2022/0005811 A1    Jan. 6, 2022

(30) Foreign Application Priority Data

Jul. 2, 2020    (KR) .................. 10-2020-0081645

(51) Int. Cl.
    *H10B 12/00*         (2023.01)

(52) U.S. Cl.
CPC ....... *H10B 12/315* (2023.02); *H10B 12/0335* (2023.02); *H10B 12/053* (2023.02); *H10B 12/09* (2023.02); *H10B 12/34* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 4,417,637 A | 11/1983 | Hardy et al. |
| 5,633,196 A | 5/1997 | Zamanian |
| 5,702,979 A | 12/1997 | Chan et al. |
| 5,705,427 A | 1/1998 | Chan et al. |
| 5,793,111 A | 8/1998 | Zamanian |
| 5,828,130 A | 10/1998 | Miller et al. |
| 5,894,160 A | 4/1999 | Chan et al. |
| 5,909,636 A | 6/1999 | Nguyen et al. |
| 5,914,518 A | 6/1999 | Nguyen et al. |
| 5,945,738 A | 8/1999 | Nguyen et al. |
| 5,956,615 A | 9/1999 | Nguyen et al. |
| 6,017,813 A | 1/2000 | Kuo |
| 6,025,265 A | 2/2000 | Miller et al. |

(Continued)

FOREIGN PATENT DOCUMENTS

| | | |
|---|---|---|
| KR | 100704132 B1 | 4/2007 |
| KR | 102008153 B1 | 10/2019 |

*Primary Examiner* — Steven M Christopher
(74) *Attorney, Agent, or Firm* — Harness, Dickey & Pierce, P.L.C.

(57) ABSTRACT

A semiconductor device includes a plurality of first conductive patterns extending parallel in a first direction on a substrate, a plurality of second conductive patterns extending parallel in a second direction crossing the first direction on the substrate, a plurality of buried contacts connected to the substrate between the plurality of first conductive patterns and between the plurality of second conductive patterns, and a landing pad connected to each of the buried contacts on the plurality of buried contacts. The landing pad includes a first side surface extending in the first direction in plan view and a second side surface extending in a third direction in plan view. The third direction is different from the first direction and the second direction in plan view.

19 Claims, 25 Drawing Sheets

(56) References Cited

U.S. PATENT DOCUMENTS

| | | | |
|---|---|---|---|
| 6,093,963 | A | 7/2000 | Chan et al. |
| RE36,938 | E | 10/2000 | Chan et al. |
| 6,468,858 | B1 | 10/2002 | Lou |
| 6,483,144 | B2 | 11/2002 | Choi |
| 6,500,751 | B2 | 12/2002 | Surprenant et al. |
| 6,586,841 | B1 | 7/2003 | Daneman et al. |
| 6,756,627 | B1 | 6/2004 | Wu et al. |
| 6,764,936 | B2 | 7/2004 | Daneman et al. |
| 7,190,508 | B2 | 3/2007 | Yang |
| 7,786,584 | B2 | 8/2010 | Barth et al. |
| 7,851,356 | B2 | 12/2010 | Tegen et al. |
| 8,318,556 | B2 | 11/2012 | Wang et al. |
| 8,703,562 | B2 | 4/2014 | Lee et al. |
| 9,064,731 | B2 | 6/2015 | Park |
| 9,324,755 | B2 | 4/2016 | Borthakur et al. |
| 9,466,486 | B2 | 10/2016 | Shieh et al. |
| 9,496,223 | B2 | 11/2016 | Lee et al. |
| 10,107,560 | B2 | 10/2018 | Wadley et al. |
| 2018/0166450 | A1 | 6/2018 | Kim et al. |
| 2018/0301456 | A1* | 10/2018 | Cho ............ H01L 27/10876 |
| 2018/0342521 | A1* | 11/2018 | Son ............ H01L 21/76816 |
| 2019/0024985 | A1 | 1/2019 | Wadley et al. |
| 2019/0096890 | A1* | 3/2019 | Lee ............ H01L 27/10814 |
| 2020/0013668 | A1* | 1/2020 | Choi ........... H01L 21/76877 |
| 2020/0083224 | A1 | 3/2020 | Chang et al. |
| 2020/0373306 | A1* | 11/2020 | Kim ............ H01L 27/10823 |

\* cited by examiner

SEMICONDUCTOR MEMORY DEVICE AND METHOD FOR FABRICATING THE SAME

CROSS-REFERENCE TO RELATED APPLICATION

This application claims priority from Korean Patent Application No. 10-2020-0081645, filed on Jul. 2, 2020 in the Korean Intellectual Property Office, and all the benefits accruing therefrom under 35 U.S.C. 119, the entire contents of which are herein incorporated by reference.

BACKGROUND

1. Technical Field

The present disclosure relates to a semiconductor memory device and/or a method for fabricating the same. More particularly, the present disclosure relates to a semiconductor memory device including a capacitor and/or a method for fabricating the same.

2. Description of the Related Art

As semiconductor memory devices become more highly integrated, individual circuit patterns have become more miniaturized to realize more semiconductor memory devices within the same area. In order to compensate for this, the aspect ratio of each circuit pattern tends to increase, but increasing the aspect ratio may increase process difficulty and may cause defects such as pattern collapse.

SUMMARY

Aspects of the present disclosure provide a semiconductor memory device having a fine circuit pattern realized with low process difficulty.

Aspects of the present disclosure also provide a method for fabricating a semiconductor memory device having a fine circuit pattern realized with low process difficulty.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, a semiconductor memory device may include a substrate, a plurality of first conductive patterns extending parallel in a first direction on the substrate, a plurality of second conductive patterns extending parallel in a second direction crossing the first direction on the substrate, a plurality of buried contacts connected to the substrate between the plurality of first conductive patterns and between the plurality of second conductive patterns, and a landing pad on and connected to each of the plurality of buried contacts. The landing pad may include a first side surface extending in the first direction in plan view and a second side surface extending in a third direction different from the first direction and the second direction in plan view.

According to another embodiment, a semiconductor memory device may include a substrate, a first conductive pattern extending in a first direction on the substrate, a first buried contact on the substrate at one side of the first conductive pattern and the first buried contact being connected to the substrate, a second buried contact on the substrate at an other side of the first conductive pattern and the second buried contact being connected to the substrate, a first landing pad connected to the first buried contact, a second landing pad connected to the second buried contact, and capacitors respectively connected to the first landing pad and the second landing pad. The first landing pad may include a first side surface that forms an acute angle with the first direction in plan view. The second landing pad may include a second side surface that is coplanar with the first side surface.

According to another embodiment, a semiconductor memory device may include a substrate, an element isolation layer on the substrate and defining a plurality of active regions in the substrate, a word line extending in a first direction crossing each of the active regions in the substrate, a bit line on the substrate and connected to each of the plurality of active regions, the bit line extending in a second direction crossing the first direction, a plurality of buried contacts on a side surface of the bit line and the plurality of buried contacts being respectively connected to the plurality of active regions, a plurality of landing pads on the plurality of buried contacts and the plurality of landing pads being respectively connected to the buried contacts, and a plurality of capacitors respectively connected to the landing pads. The plurality of landing pads may be arranged in a honeycomb structure. Each of the plurality of landing pads may include a first side surface extending in the first direction in plan view and a second side surface extending in a third direction different from the first direction and the second direction in plan view.

According to an embodiment, a method for fabricating a semiconductor memory device comprising may include forming a plurality of first conductive patterns on a substrate, the plurality of first conductive patterns extending parallel in a first direction; forming a plurality of second conductive patterns on the substrate, the plurality of second conductive patterns extending parallel in a second direction crossing the first direction; forming a plurality of buried contacts connected to the substrate between the plurality of first conductive patterns and between the plurality of second conductive patterns; forming a preliminary landing pad on the plurality of buried contacts, the preliminary landing pad overlapping at least two buried contacts of the plurality of buried contacts, and the preliminary landing pad extending in a third direction different from the first direction and the second direction; and patterning the preliminary landing pad to form landing pads connected to the at least two buried contacts.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor memory device according to some embodiments will be described with reference to FIGS. 1 to 5.

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

Figure 1:
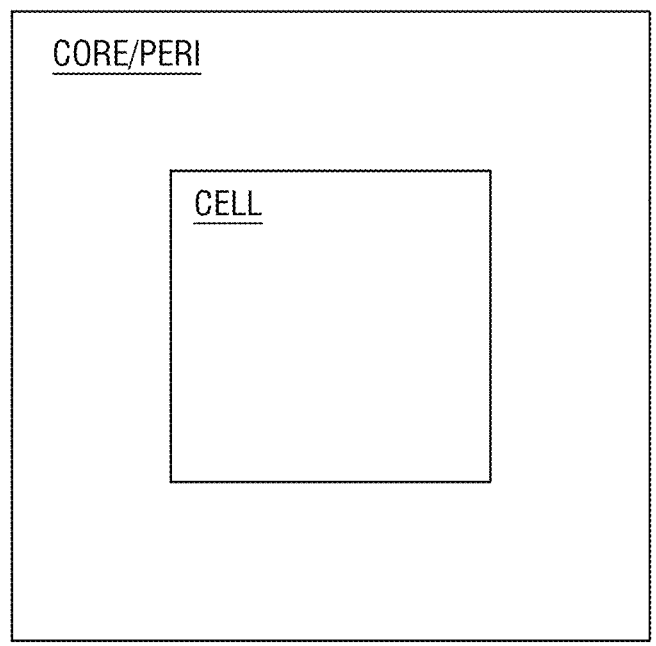
FIG. 1 is an example layout diagram illustrating a semiconductor memory device according to some embodiments.
Figure 2:
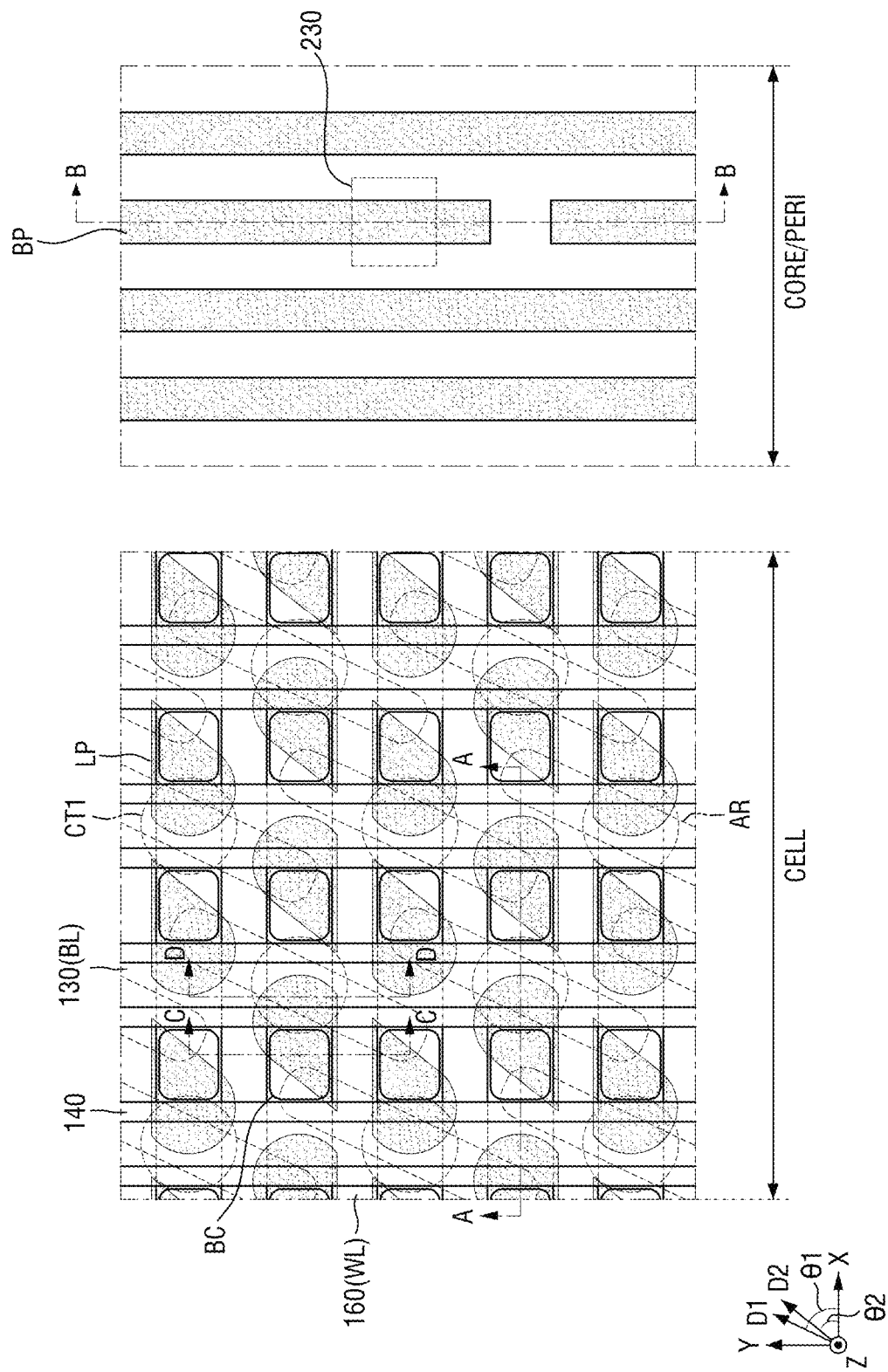
FIG. 2 is a partial layout diagram illustrating a cell area and a core/peri area of FIG. 1.
Figure 3:
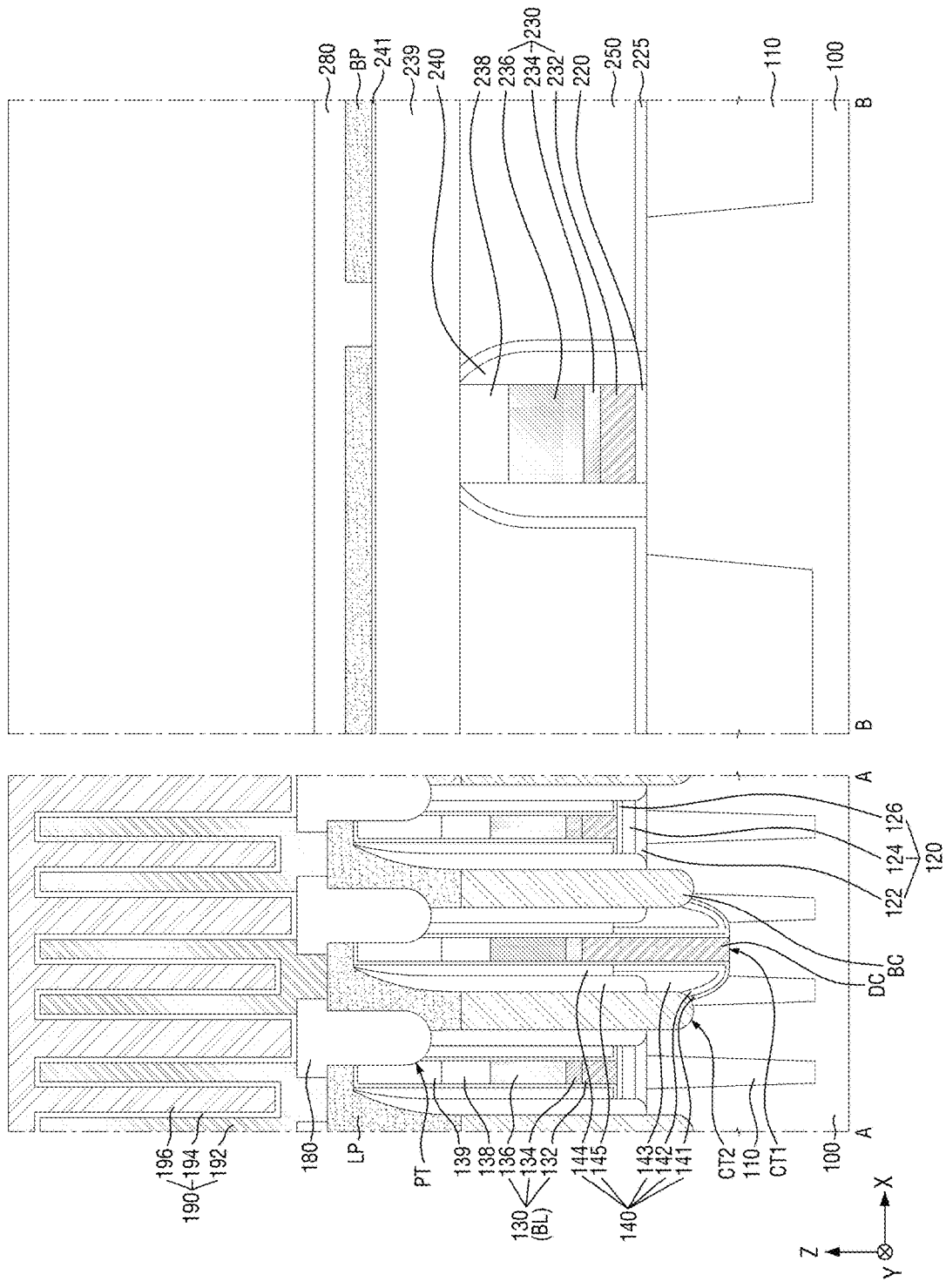
FIG. 3 shows cross-sectional views taken along lines A-A and B-B of FIG. 2.
Figure 4:
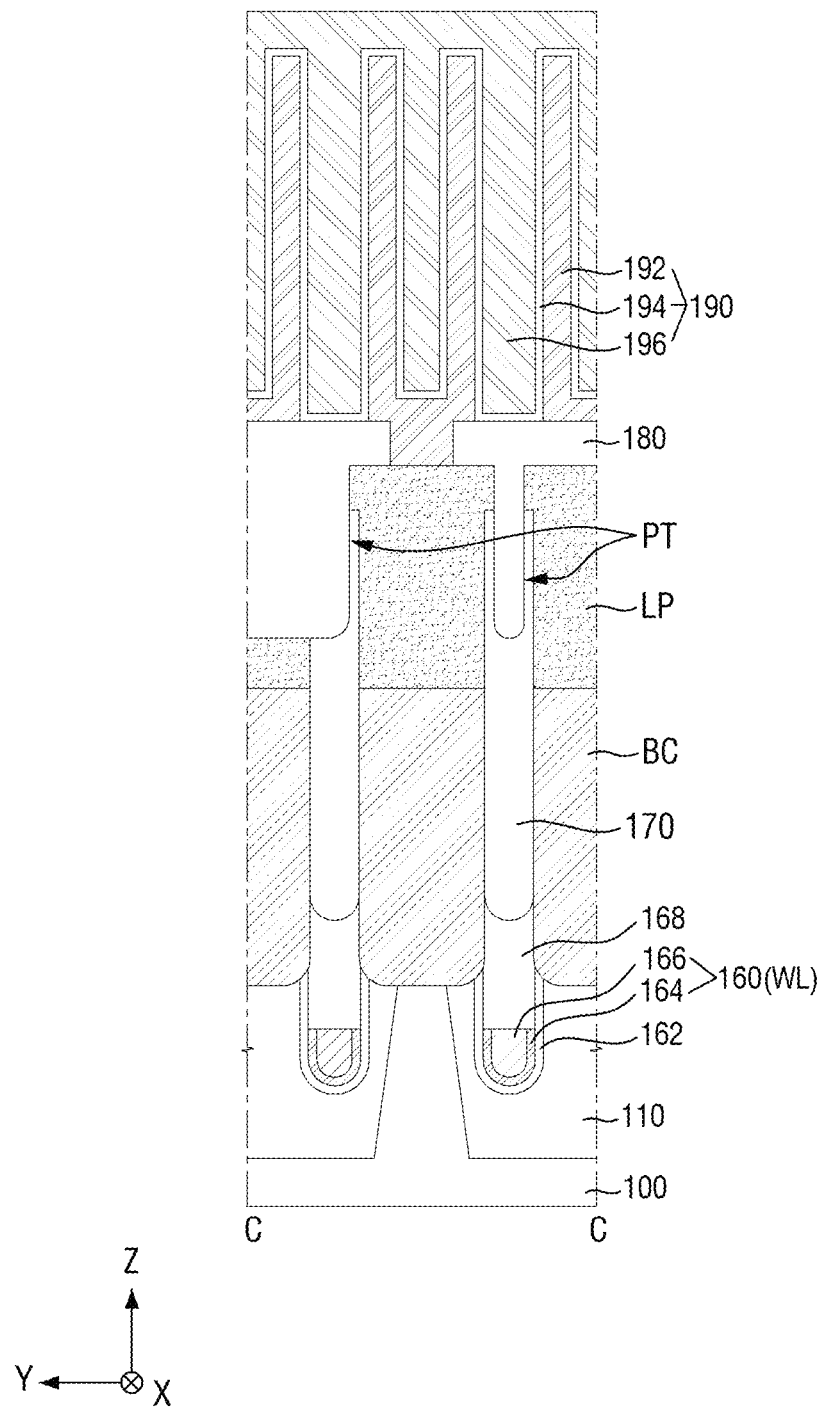
FIG. 4 is a cross-sectional view taken along line C-C of FIG. 2.
Figure 5:
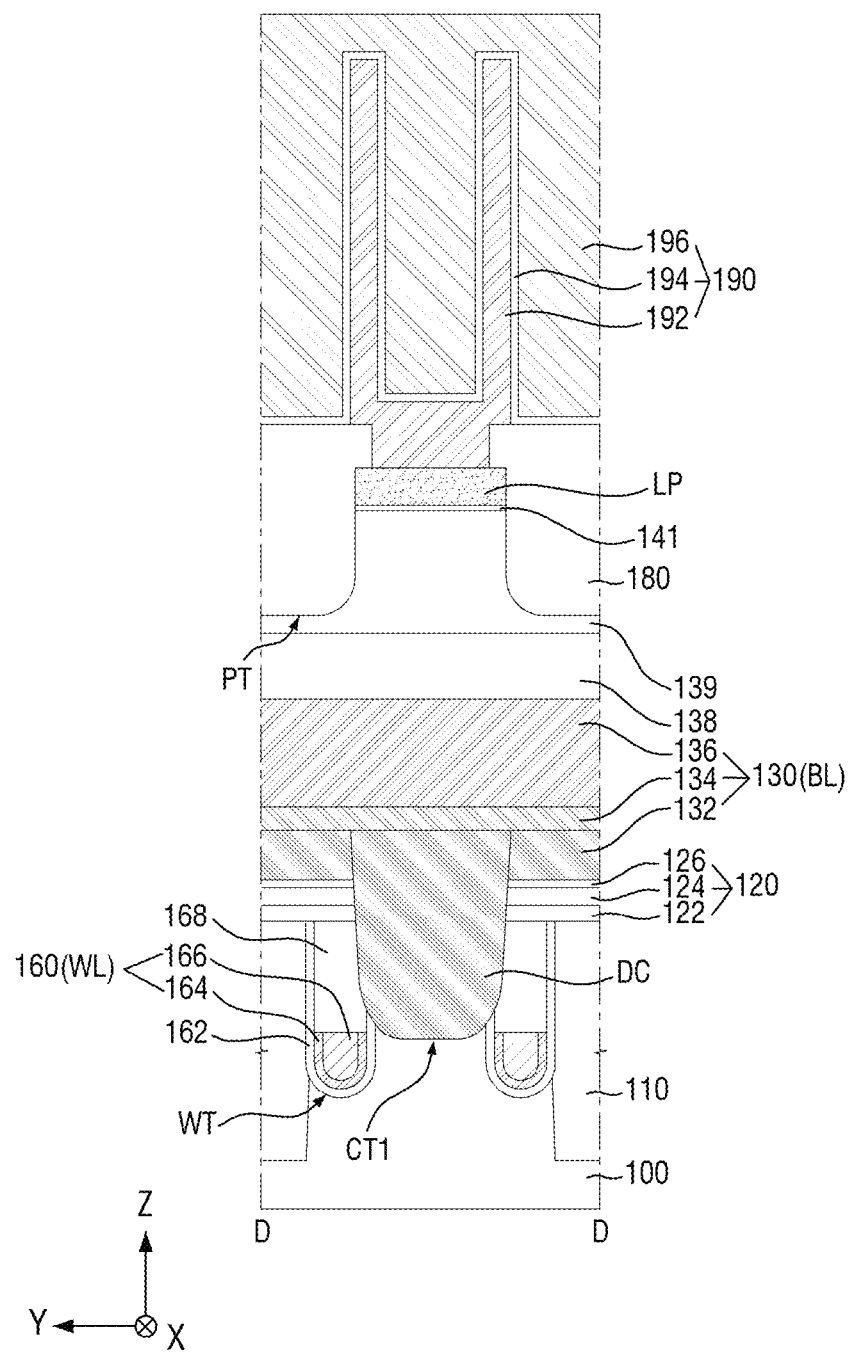
FIG. 5 is a cross-sectional view taken along line D-D of FIG. 2.

FIG. 1 is an example layout diagram illustrating a semiconductor memory device according to some embodiments. FIG. 2 is a partial layout diagram illustrating a cell area and a core/peri area of FIG. 1. FIG. 3 shows cross-sectional views taken along lines A-A and B-B of FIG. 2. FIG. 4 is a cross-sectional view taken along line C-C of FIG. 2. FIG. 5 is a cross-sectional view taken along line D-D of FIG. 2.

Referring to FIG. 1, the semiconductor memory device according to some embodiments includes a cell area CELL and a core/peri area CORE/PERI.

In the cell area CELL, an element isolation layer 110, a base insulating layer 120, a word line WL, a bit line BL, a direct contact DC, a bit line spacer 140, a buried contact BC, a landing pad LP, a capacitor 190, and the like, which will be described later, may be formed to implement semiconductor memory elements on a substrate 100.

The core/peri area CORE/PERI may be arranged around the cell area CELL. For example, the core/peri area CORE/PERI may surround the cell area CELL. In the core/peri area CORE/PERI, control elements and dummy elements such as a third conductive pattern 230 and a wiring pattern BP, which will be described later, may be formed to control functions of the semiconductor memory elements formed in the cell area CELL.

Referring to FIGS. 2 to 5, the semiconductor memory device according to some embodiments includes the substrate 100, the element isolation layer 110, the base insulating layer 120, the word line WL, the bit line BL, the direct contact DC, the bit line spacer 140, the buried contact BC, the landing pad LP, the capacitor 190, the third conductive pattern 230, and the wiring pattern BP.

The substrate 100 may have a structure in which a base substrate and an epitaxial layer are stacked, but inventive concepts are not limited thereto. The substrate 100 may be a silicon substrate, a gallium arsenide substrate, a silicon germanium substrate, or a silicon-on-insulator (SOI) substrate. For example, the substrate 100 may be a silicon substrate in the following description.

The substrate 100 may include an active region AR. As the design rule of the semiconductor memory device decreases, the active region AR may be formed in a diagonal bar shape. For example, as shown in FIG. 2, the active region AR may have a bar shape extending in a third direction D1 different from a first direction X and a second direction Y on a plane on which the first direction X and the second direction Y extend. In some embodiments, the third direction D1 may form a first acute angle $\theta 1$ with the first direction X. The first acute angle $\theta 1$ may be, for example, 60 degrees, but is not limited thereto.

The active region AR may be in the form of a plurality of bars extending in directions parallel to each other. In addition, one of a plurality of active regions AR may be arranged such that its center is located close to an end of another active region AR.

The active region AR may include impurities to function as a source/drain region. In some embodiments, the center of the active region AR may be connected to the bit line BL via the direct contact DC, and both ends of the active region AR may be connected to the capacitor 190 via the buried contact BC and the landing pad LP.

The element isolation layer 110 may define the plurality of active regions AR. Although it is shown in FIGS. 2 to 5 that the element isolation layer 110 has an inclined side surface due to the characteristics of the employed process, inventive concepts are not limited thereto.

The element isolation layer 110 may include at least one of silicon oxide, silicon nitride or a combination thereof, but is not limited thereto. The element isolation layer 110 may be a single layer made of one kind of insulating material or a multilayer made of a combination of several kinds of insulating materials.

The base insulating layer 120 may be formed on the substrate 100 and the element isolation layer 110. In some embodiments, the base insulating layer 120 may extend along the top surface of the substrate 100 and the top surface of the element isolation layer 110 in a region where the direct contact DC and the buried contact BC are not formed.

The base insulating layer 120 may be a single layer or a multilayer as shown in the drawing. For example, the base insulation layer 120 may include a first insulating layer 122, a second insulating layer 124, and a third insulating layer 126 sequentially stacked on the substrate 100.

The first insulating layer 122 may include, for example, silicon oxide. The second insulating layer 124 may include a material have an etch selectivity different from that of the first insulating layer 122. For example, the second insulating layer 124 may include silicon nitride. The third insulating layer 126 may include a material having a dielectric constant smaller than that of the second insulating layer 124. For example, the third insulating layer 126 may include silicon oxide.

The word line WL may be elongated in the first direction X across the active region AR and the bit line BL. For example, as shown in FIG. 2, the word line WL may traverse the active region AR obliquely and traverse the bit line BL vertically. The word line WL may be interposed between the direct contact DC and the buried contact BC to be described later. A plurality of word lines WL may extend in parallel to each other. For example, the plurality of word lines WL may be formed to be separated at equal intervals and extend in the first direction X.

As shown in FIGS. 4 and 5, the word line WL may include a first conductive pattern 160. The first conductive pattern 160 may be a single layer or a multilayer as shown in the drawing. For example, the first conductive pattern 160 may include a first sub-conductive pattern 164 and a second sub-conductive pattern 166 sequentially stacked on the substrate 100. The first and second sub-conductive patterns 164 and 166 may each include, for example, at least one of metal, polysilicon or a combination thereof, but is not limited thereto.

A word line dielectric layer 162 may be interposed between the first conductive pattern 160 and the substrate 100. The word line dielectric layer 162 may include, for example, at least one of silicon oxide, silicon oxynitride, silicon nitride, or a high permittivity (high-k) material having a dielectric constant greater than that of silicon oxide, but is not limited thereto.

A word line capping pattern 168 may be formed on the first conductive pattern 160. The word line capping pattern 168 may include silicon nitride, but is not limited thereto.

In some embodiments, the word line WL may be buried in the substrate 100. For example, the substrate 100 may include a word line trench WT extending in the first direction X. The word line dielectric layer 162 may extend along the profile of the word line trench WT. The first conductive pattern 160 may fill a part of the word line trench WT on the word line dielectric layer 162. The word line capping pattern 168 may fill another part of the word line trench WT on the first conductive pattern 160. Accordingly, the top surface of the first conductive pattern 160 may be formed to be lower than the top surface of the substrate 100.

The bit line BL may be formed on the substrate 100, the element isolation layer 110, and the base insulating layer 120. The bit line BL may be elongated in the second direction Y to traverse the active region AR and the word line WL. For example, the bit line BL may traverse the active region AR obliquely and traverse the word line WL vertically. A plurality of bit lines BL may extend in parallel to each other. For example, the plurality of bit lines BL may be formed to be separated at equal intervals and extend in the second direction Y.

As shown in FIG. 3, the bit line BL may include a second conductive pattern 130. The second conductive pattern 130 may be a single layer or a multilayer as shown in the drawing. For example, the second conductive pattern 130 may include a third sub-conductive pattern 132, a fourth sub-conductive pattern 134, and a fifth sub-conductive pattern 136 sequentially stacked on the substrate 100.

The third sub-conductive pattern 132, the fourth sub-conductive pattern 134, and the fifth sub-conductive pattern 136 may each include, for example, polysilicon, TiN, TiSiN, tungsten, tungsten silicide, or a combination thereof, without being limited thereto. For example, the third sub-conductive pattern 132 may include polysilicon, the fourth sub-conductive pattern 134 may include TiSiN, and the fifth sub-conductive pattern 136 may include tungsten.

A first bit line capping pattern 138 and a second bit line capping pattern 139 may be sequentially formed on the second conductive pattern 130. The first and second bit line capping patterns 138 and 139 may extend along the top surface of the second conductive pattern 130. The first and second bit line capping patterns 138 and 139 may include silicon nitride, without being limited thereto.

The direct contact DC may be formed on the substrate 100 and the element isolation layer 110. The direct contact DC may penetrate the base insulating layer 120 to connect the active region AR of the substrate 100 to the bit line BL. For example, the substrate 100 may include a first contact trench CT1. The first contact trench CT1 may penetrate the base insulating layer 120 to expose at least a part of the active region AR. The direct contact DC may be formed in the first contact trench CT1 to connect the active region AR of the substrate 100 to the second conductive pattern 130.

In some embodiments, the first contact trench CT1 may expose the center of each active region AR. Accordingly, the direct contact DC may be connected to the center of the active region AR. In some embodiments, a part of the first contact trench CT1 may overlap a part of the element isolation layer 110. Accordingly, the first contact trench CT1 may expose a part of the element isolation layer 110 as well as a part of the active region AR.

In some embodiments, the direct contact DC may be smaller in width than the first contact trench CT1. For example, the direct contact DC may contact only a part of the substrate 100 exposed by the first contact trench CT1 as shown in FIG. 3. In some embodiments, the bit line BL may be smaller in width than the first contact trench CT1. For example, the bit line BL may be equal in width to the direct contact DC.

The direct contact DC may include a conductive material. Accordingly, the bit line BL may be electrically connected to the active region AR of the substrate 100. The active region AR of the substrate 100 that is connected to the direct contact DC may function as a source/drain region of a semiconductor element including the word line WL.

In some embodiments, the direct contact DC may include a material that is the same as that of the third sub-conductive pattern 132. For example, the direct contact DC may include polysilicon. However, inventive concepts are not limited thereto, and the direct contact DC may include a material different from that of the third sub-conductive pattern 132 depending on the fabrication process.

The bit line spacer 140 may be formed on the side surface of the bit line BL. The bit line spacer 140 may extend along the side surface of the bit line BL. For example, the bit line spacer 140 may be elongated in the second direction Y as shown in FIGS. 2 and 3.

In some embodiments, the bit line spacer 140 may be a multilayer formed of a combination of several kinds of insulating materials. For example, the bit line spacer 140 may include a first spacer 141, a second spacer 142, a third spacer 143, a fourth spacer 144, and a fifth spacer 145.

The first spacer 141 may extend along the side surface of the bit line BL. For example, the first spacer 141 may extend the side surfaces of the second conductive pattern 130, the first bit line capping pattern 138, and the second bit line capping pattern 139.

The first spacer 141 may extend along the side surface of the bit line BL and the top surface of the base insulating layer 120 in a region where the first contact trench CT1 is not formed. The first spacer 141 may extend along the side surface of the bit line BL, the side surface of the direct contact DC, and the first contact trench CT1 in a region where the first contact trench CT1 is formed. In some embodiments, the first spacer 141 may contact the bit line BL and the direct contact DC.

The second spacer 142 may be formed on the first spacer 141 in the first contact trench CT1. For example, the second spacer 142 may extend along the profile of the first spacer 141 in the first contact trench CT1.

The third spacer 143 may be formed on the second spacer 142 in the first contact trench CT1. The third spacer 143 may fill a region of the first contact trench CT1 that remains after the formation of the first and second spacers 141 and 142.

The fourth spacer 144 may be formed on the second and third spacers 142 and 143. The fourth spacer 144 may extend along at least a part of the side surface of the bit line BL. For example, the fourth spacer 144 may extend along a part of the side surface of the first spacer 141.

The fifth spacer 145 may be formed on the third spacer 143. The fifth spacer 145 may extend along at least a part of the side surface of the bit line BL. For example, the fifth spacer 145 may extend along the side surface of the fourth spacer 144.

In some embodiments, the bottom surface of the fifth spacer 145 may be formed to be lower than the uppermost surface of the third spacer 143. For example, a lower portion of the fifth spacer 145 may be buried in the third spacer 143.

The first spacer 141, the second spacer 142, the third spacer 143, the fourth spacer 144, and the fifth spacer 145 may each include at least one of silicon oxide, silicon oxynitride, silicon nitride, or a combination thereof. For example, the first spacer 141 may include silicon nitride, the second spacer 142 may include silicon oxide, the third spacer 143 may include silicon nitride, the fourth spacer 144 may include silicon oxide, and the fifth spacer 145 may include silicon nitride.

In some embodiments, the bit line spacer 140 may include an air spacer. The air spacer may be formed of air or void. Since the air spacer may have a dielectric constant smaller than that of silicon oxide, it is possible to effectively reduce parasitic capacitance of the semiconductor memory device according to some embodiments. For example, the fourth spacer 144 may be an air spacer.

The buried contact BC may be formed on the substrate 100 and the element isolation layer 110. The buried contact BC may penetrate the base insulating layer 120 to connect the active region AR of the substrate 100 to the landing pad LP to be described later. For example, the substrate 100 may include a second contact trench CT2. The second contact trench CT2 may penetrate the base insulating layer 120 to expose at least a part of the active region AR. The buried contact BC may be formed in the second contact trench CT2 to connect the active region AR of the substrate 100 to the landing pad LP.

In some embodiments, the second contact trench CT2 may expose both ends of each active region AR. Accordingly, the buried contact BC may be connected to both ends of the active region AR. In some embodiments, a part of the second contact trench CT2 may overlap a part of the element isolation layer 110. Accordingly, the second contact trench CT2 may expose a part of the element isolation layer 110 as well as a part of the active region AR.

The buried contact BC may be formed on the side surface of the bit line BL. Further, the buried contact BC may be spaced apart from the bit line BL by the bit line spacer 140. For example, the buried contact BC may extend along the side surface of the bit line spacer 140 as shown in FIG. 3. A plurality of buried contacts BC arranged along the first direction X may be separated from each other by the bit line BL and the bit line spacer 140 elongated in the second direction Y. In some embodiments, the top surface of the buried contact BC may be formed to be lower than the top surface of the second bit line capping pattern 139.

The buried contact BC may be formed on the side surface of the word line WL. For example, an insulating fence 170 elongated in the first direction X may be formed on the word line capping pattern 168 as shown in FIG. 4. The buried contact BC may extend along the side surface of the word line capping pattern 168 or the side surface of the insulating fence 170. The plurality of buried contacts BC arranged along the second direction Y may be separated from each other by the word line capping pattern 168 and/or the insulating fence 170 elongated in the first direction X.

The buried contacts BC may form a plurality of isolated regions separated from each other. For example, as shown in FIG. 2, the plurality of buried contacts BC may be interposed between the plurality of bit lines BL and between the plurality of word lines WL. In some embodiments, the buried contacts BC may be arranged in a lattice structure.

The buried contact BC may include a conductive material. Accordingly, the buried contact BC may be electrically connected to the active region AR of the substrate 100. The active region AR of the substrate 100 that is connected to the buried contact BC may function as a source/drain region of a semiconductor element including the word line WL. The buried contact BC may include, for example, polysilicon, without being limited thereto.

The landing pad PL may be formed on the buried contact BC. The landing pad PL may be disposed to overlap the buried contact BC. The term "overlapping" as used herein means overlapping in a vertical direction Z perpendicular to the top surface of the substrate 100. The landing pad LP may be connected to the top surface of the buried contact BC to connect the active region AR of the substrate 100 to the capacitor 190 to be described later.

In some embodiments, the landing pad LP may be disposed to overlap a part of the buried contact BC and a part of the bit line BL. For example, the landing pad LP may overlap a part of the buried contact BC and a part of the second bit line capping pattern 139 as shown in FIGS. 2 and 3. In some embodiments, the top surface of the landing pad LP may be formed to be higher than the top surface of the second bit line capping pattern 139. Accordingly, the landing pad LP may cover a part of the top surface of the second bit line capping pattern 139.

The landing pads LP may form a plurality of isolated regions separated from each other. For example, as illustrated in FIG. 3, a pad trench PT may be formed to define the plurality of landing pads LP. In some embodiments, a part of the pad trench PT may expose a part of the second bit line capping pattern 139. For example, the pad trench PT may be formed to extend from the top surface of the landing pad LP such that the bottom surface thereof is lower than the top surface of the second bit line capping pattern 139. Accordingly, the plurality of landing pads LP may be separated from each other by the second bit line capping pattern 139 and the pad trench PT.

The landing pad LP may include a conductive material. Accordingly, the capacitor 190 to be described later may be electrically connected to the active region AR of the substrate 100 via the buried contact BC and the landing pad LP. The landing pad LP may include, for example, tungsten, without being limited thereto.

In some embodiments, the plurality of landing pads LP may be arranged in a honeycomb structure. In addition, each landing pad LP may include a side surface extending in a fourth direction D2 different from the first direction X and the second direction Y in plan view. A detailed description thereof will be given later with reference to FIG. 6.

In some embodiments, a first interlayer insulating layer 180 may be formed to fill the pad trench PT. The first interlayer insulating layer 180 may be formed on the landing pad LP and the second bit line capping pattern 139. Accordingly, the first interlayer insulating layer 180 may define a region of the landing pads LP forming a plurality of isolated regions.

The first interlayer insulating layer 180 may include an insulating material to electrically separate the plurality of landing pads LP from each other. For example, the interlayer insulating layer 180 may include at least one of silicon oxide, silicon oxynitride, silicon nitride, and a low permittivity (low-k) material having a dielectric constant smaller than that of the silicon oxide, but is not limited thereto.

The capacitor 190 may be disposed on the first interlayer insulating layer 180 and the landing pad LP. The capacitor 190 may be connected to the top surface of the landing pad LP. For example, the first interlayer insulating layer 180 may be patterned to expose at least a part of the top surface of the landing pad LP. The capacitor 190 may be connected to a part of the top surface of the landing pad LP exposed by the first interlayer insulating layer 180. Accordingly, the capacitor 190 may be electrically connected to the active region AR of the substrate 100 via the buried contact BC and the landing pad LP. Accordingly, the capacitor 190 may be controlled by the bit line BL and the word line WL to store data.

In some embodiments, the capacitor 190 may include a lower electrode 192, a capacitor dielectric layer 194, and an upper electrode 196. The capacitor 190 may store electric charges in the capacitor dielectric layer 194 by using a potential difference generated between the lower electrode 192 and the upper electrode 196.

The lower electrode 192 and the upper electrode 196 may include, for example, doped polysilicon, metal, or metal nitride, without being limited thereto. In addition, the capacitor dielectric layer 194 may include, for example, silicon oxide or a high-k material, without being limited thereto.

The third conductive pattern 230 may be formed on the substrate 100 in the core/peri area CORE/PERI. The third conductive pattern 230 may control functions of the semiconductor memory elements formed in the cell area CELL. For example, the third conductive pattern 230 may function as a gate electrode constituting a transistor.

Although the third conductive pattern 230 is shown in the form of an isolated island in FIG. 2, it is merely an example. For example, the third conductive pattern 230 may have a shape elongated in the first direction X or the second direction Y.

The third conductive pattern 230 may be a single layer or a multilayer as shown in the drawing. For example, the third conductive pattern 230 may include a sixth sub-conductive pattern 232, a seventh sub-conductive pattern 234, and an eighth sub-conductive pattern 236 sequentially stacked on the substrate 100.

The sixth sub-conductive pattern 232, the seventh sub-conductive pattern 234, and the eighth sub-conductive pattern 236 may each include for example at least one of polysilicon, TiN, TiSiN, tungsten, tungsten silicide, or a combination thereof, without being limited thereto. For example, the sixth sub-conductive pattern 232 may include polysilicon, the seventh sub-conductive pattern 234 may include TiSiN, and the eighth sub-conductive pattern 236 may include tungsten.

In some embodiments, the second and third conductive patterns 130 and 230 may be formed at the same level. The term "the same level" as used herein means being formed by the same manufacturing process. For example, the third and sixth sub-conductive patterns 132 and 232 may include the same material, the fourth and seventh sub-conductive patterns 134 and 234 may include the same material, and the fifth and eighth sub-conductive patterns 136 and 236 may include the same material.

A gate dielectric layer 220 may be interposed between the third conductive pattern 230 and the substrate 100. The gate dielectric layer 220 may include, for example, at least one of silicon oxide, silicon oxynitride, silicon nitride, and a high permittivity (high-k) material having a dielectric constant greater than that of the silicon oxide, without being limited thereto. In some embodiments, the first insulating layer 122 and the gate dielectric layer 220 may be formed at the same level.

A gate capping pattern 238 may be formed on the third conductive pattern 230. The gate capping pattern 238 may extend along the top surface of the third conductive pattern 230. The gate capping pattern 238 may include silicon nitride, without being limited thereto. In some embodiments, the first bit line capping pattern 138 and the gate capping pattern 238 may be formed at the same level.

A gate spacer 240 may be formed on the side surface of the third conductive pattern 230. The gate spacer 240 may extend the side surface of the third conductive pattern 230 and/or the side surface of the gate capping pattern 238. The gate spacer 240 may include, for example, at least one of silicon oxide, silicon oxynitride, silicon nitride, or a combination thereof, without being limited thereto.

In some embodiments, a first liner layer 225 may be formed to extend along the top surface of the substrate 100, the top surface of the element isolation layer 110, and the side surface of the gate spacer 240. The first liner layer 225 may function as an etch stop layer, but is not limited thereto.

In some embodiments, a second interlayer insulating layer 250 and a third interlayer insulating layer 239 may be formed to be sequentially stacked on the substrate 100. For example, the second interlayer insulating layer 250 may cover the top and side surfaces of the first liner layer 225. The third interlayer insulating layer 239 may cover the top surface of the gate capping pattern 238 and the top surface of the second interlayer insulating layer 250.

The wiring pattern BP may be formed on the third conductive pattern 230. For example, the wiring pattern BP may extend along the top surface of the second interlayer insulating layer 250. In some embodiments, the wiring pattern BP may be a bypass wiring. The wiring pattern BP may include, for example, tungsten (W) or aluminum (Al), without being limited thereto.

In some embodiments, a second liner layer 241 may be formed between the wiring pattern BP and the second interlayer insulating layer 250. The second liner layer 241 may extend along the top surface of the second interlayer insulating layer 250. The second liner layer 241 may function as an etch stop layer, but is not limited thereto. In some embodiments, the first spacer 141 and the second liner layer 241 may be formed at the same level.

A fourth interlayer insulating layer 280 may be formed on the wiring pattern BP. The fourth interlayer insulating layer 280 may be formed to cover the top surface of the wiring pattern BP. In some embodiments, the fourth interlayer insulating layer 280 and the first interlayer insulating layer 180 may be formed at the same level.

Hereinafter, a description is made in detail of the landing pad of the semiconductor memory device according to some embodiments with reference to FIG. 6.

Figure 6:
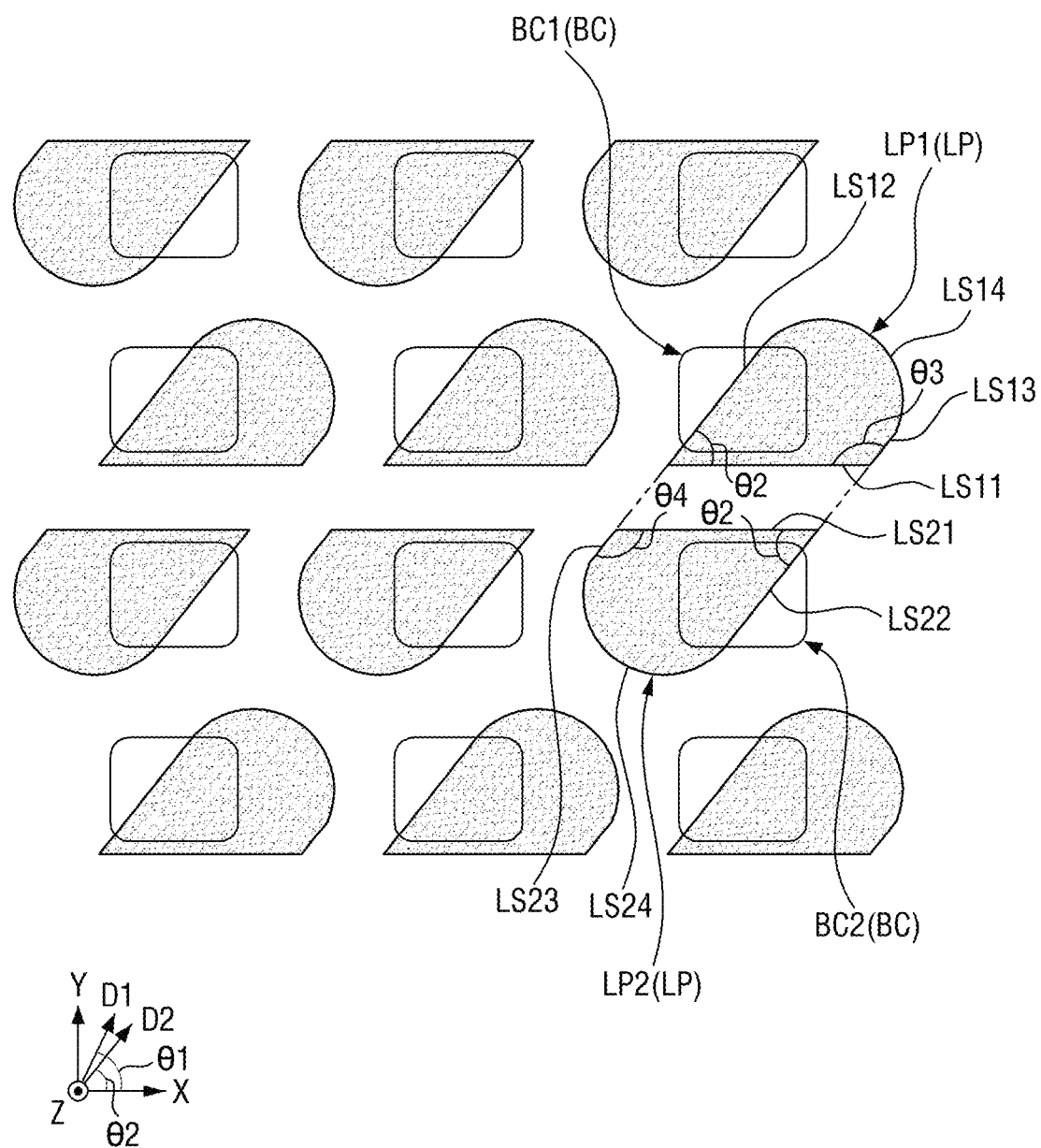
FIG. 6 is a partial layout diagram illustrating the landing pad of FIGS. 2 to 5.

FIG. 6 is a partial layout diagram illustrating the landing pad of FIGS. 2 to 5. For simplicity of description, redundant parts of the description made with reference to FIGS. 1 to 5 may be recapitulated or omitted herein below. In addition, for simplicity of description, FIG. 6 depicts the buried contacts BC and the landing pads LP, leaving out other components.

Referring to FIG. 6, the plurality of landing pads LP may be formed to be connected to the respective buried contacts BC.

For example, the plurality of buried contacts BC may include a first buried contact BC1 and a second buried contact BC2 adjacent to each other. The first and second buried contacts BC1 and BC2 may be, for example, be arranged along the second direction Y.

The plurality of landing pads LP may include a first landing pad LP1 connected to the first buried contact BC1 and a second landing pad LP2 connected to the second buried contact BC2. In some embodiments, the first and second landing pads LP1 and LP2 may be arranged along the fourth direction D2 different from the first direction X and the second direction Y.

In some embodiments, the fourth direction D2 may form a second acute angle θ2 with the first direction X. Although it is shown in FIGS. 2 and 6 that the second acute angle θ2 is smaller than the first acute angle θ1, it is merely an example. For example, the second acute angle θ2 may be equal to or greater than the first acute angle θ1. The second acute angle θ2 may be equal to or greater than 60 degrees.

The first and second landing pads LP1 and LP2 may each have a side surface extending in the fourth direction D2 different from the first direction X and the second direction Y in plan view. For example, the first landing pad LP1 may include first to fourth side surfaces LS11, LS12, LS13, and LS14, and the second landing pad LP2 may include fifth to eighth side surfaces LS21, LS22, LS23, and LS24. The first to fourth side surfaces LS11, LS12, LS13, and LS14 may each form a closed loop in plan view, and the fifth to eighth side surfaces LS21, LS22, LS23, and LS24 may each form a closed loop in plan view.

The first side surface LS11 may extend in the first direction X. In some embodiments, the first side surface LS11 may include a flat surface. For example, the first side surface LS11 may form a straight line in plan view.

The second side surface LS12 may extend from the first side surface LS11 in the fourth direction D2. In some embodiments, the second side surface LS12 may form the second acute angle θ2 with the first side surface LS11.

The third side surface LS13 may be opposite to the second side surface LS12 and extend from the first side surface LS11. In some embodiments, the third side surface LS13 may be parallel to the second side surface LS12. For example, the third side surface LS13 may extend from the first side surface LS11 in the fourth direction D2. The third side surface LS13 may form a first obtuse angle θ3 with the first side surface LS11. The first obtuse angle θ3 may be equal to or less than 120 degrees. In the case where the second and third side surfaces LS12 and LS13 are parallel to each other, the sum of the second acute angle θ2 and the first obtuse angle θ3 may be 180 degrees.

The fourth side surface LS14 may be opposite to the first side surface LS11 and connect the second side surface LS12 to the third side surface LS13. In some embodiments, the fourth side surface LS14 may include a curved surface. For example, the fourth side surface LS14 may form a convex curve in plan view. This may be due to the nature of the etching process for forming the first landing pad LP1.

The fifth side surface LS21 may face the first side surface LS11. In some embodiments, the fifth side surface LS21 may include a flat surface. For example, the fifth side surface LS21 may form a straight line in plan view. In some embodiments, the fifth side surface LS21 may be parallel to the first side surface LS11. For example, the fifth side surface LS21 may extend in the first direction X.

The sixth side surface LS22 may extend from the fifth side surface LS21 in the fourth direction D2. In some embodiments, the sixth side surface LS22 may form the second acute angle θ2 with the fifth side surface LS21. Accordingly, in the case where the first and fifth side surfaces LS11 and LS21 are parallel to each other, the second and sixth side surfaces LS12 and LS22 may be parallel to each other. In some embodiments, the sixth side surface LS22 may be coplanar with the third side surface LS13. That is, one plane including both the third side surface LS13 and the sixth side surface LS22 may exist.

The seventh side surface LS23 may be opposite to the sixth side surface LS22 and extend from the fifth side surface LS21. In some embodiments, the seventh side surface LS23 may be parallel to the sixth side surface LS22. For example, the seventh side surface LS23 may extend from the fifth side surface LS21 in the fourth direction D2. The seventh side surface LS23 may form a second obtuse angle θ4 with the fifth side surface LS21. The second obtuse angle θ4 may be equal to or less than 120 degrees. In the case where the sixth and seventh side surfaces LS22 and LS23 are parallel to each other, the sum of the second acute angle θ2 and the second obtuse angle θ4 may be 180 degrees. In some embodiments, the seventh side surface LS23 may be coplanar with the second side surface LS12. That is, one plane including both the second side surface LS12 and the seventh side surface LS23 may exist.

In some embodiments, the first obtuse angle θ3 may be equal to the second obtuse angle θ4. The term "same" as used herein not only means being completely identical but also includes a minute difference that may occur due to a process margin and the like.

The eighth side surface LS24 may be opposite to the fifth side surface LS21 and connect the sixth side surface LS22 to the seventh side surface LS23. In some embodiments, the eighth side surface LS24 may include a curved surface. For example, the eighth side surface LS24 may form a convex curve in plan view. This may be due to the nature of the etching process for forming the second landing pad LP2.

Although it is shown that the second side surface LS12 is equal in length to the sixth side surface LS22 and the third side surface LS13 is equal in length to the seventh side surface LS23 in plan view, it is merely an example. For example, it goes without saying that the length of the second side surface LS12 may be shorter than the length of the sixth side surface LS22, and the length of the third side surface LS13 may be shorter than the length of the seventh side surface LS23.

Although it is only shown that the first and second buried contacts BC1 and BC2 are arranged along the second direction Y, inventive concepts are not limited thereto. For example, the first and second buried contacts BC1 and BC2 may be arranged along the first direction X. In this case, the first side surface LS11 of the first landing pad LP1 and the fifth side surface LS21 of the second landing pad LP2 may extend in the second direction Y.

Hereinafter, various semiconductor memory devices according to some embodiments will be described with reference to FIGS. 7 to 11.

FIGS. 7 to 11 are various partial layout diagrams for explaining a semiconductor memory device according to some embodiments. For simplicity of description, redundant parts of the description made with reference to FIGS. 1 to 6 may be summarized or omitted herein below.

Figure 7:
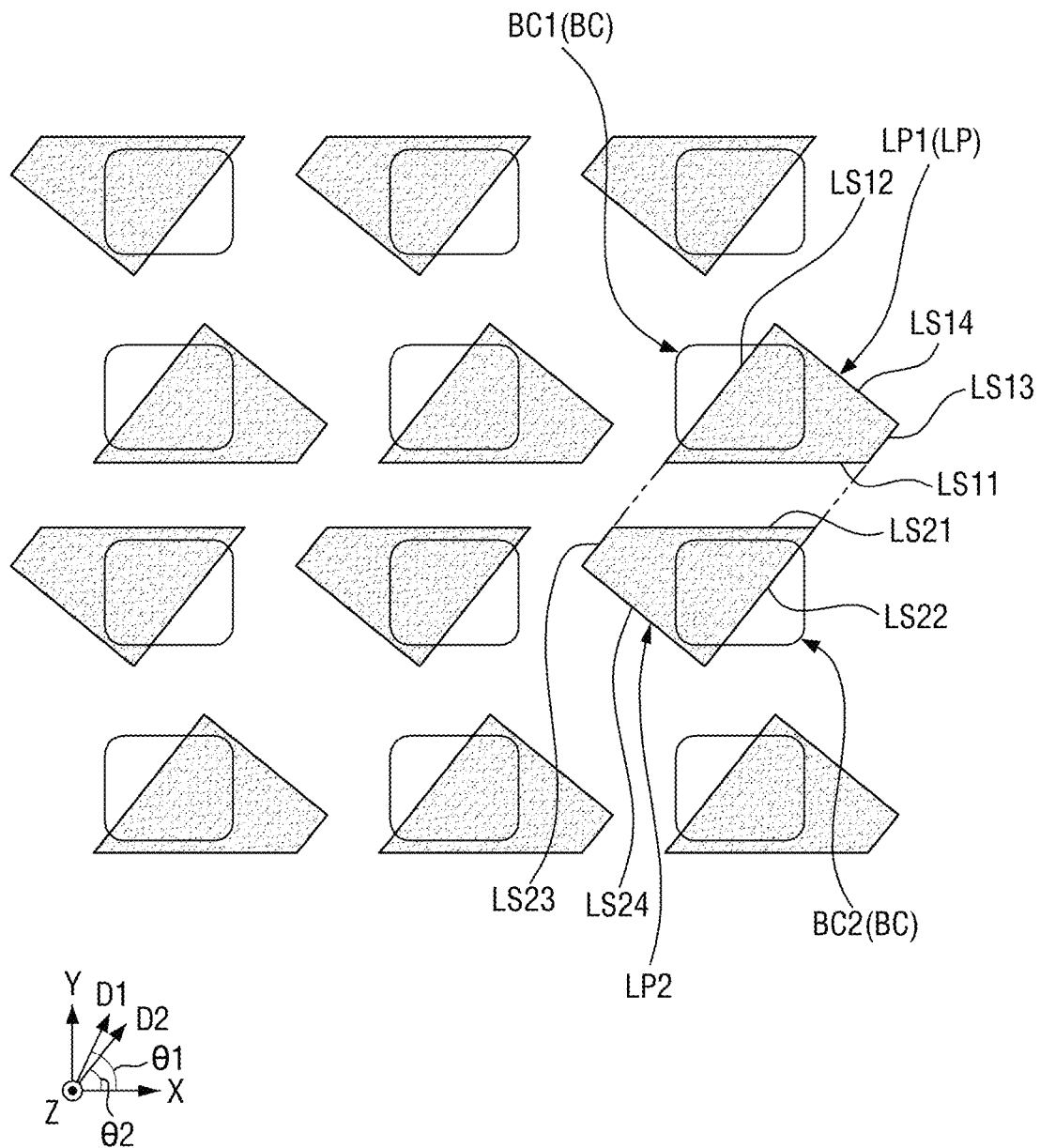
FIGS. 7 to 11 are various partial layout diagrams for explaining a semiconductor memory device according to some embodiments.

Referring to FIG. 7, in the semiconductor memory device according to some embodiments, the fourth side surface LS14 of the first landing pad LP1 and the eighth side surface LS24 of the second landing pad LP2 may include a flat surface.

For example, the fourth and eighth side surfaces LS14 and LS24 may form a straight line in plan view. This may be due to the nature of the etching process for forming the first and second landing pads LP1 and LP2.

Although it is shown in FIG. 7 that the fourth side surface LS14 is orthogonal to the second and third side surfaces LS12 and LS13 and the eighth side surface LS24 is orthogonal to the sixth and seventh side surfaces LS22 and LS23, it is merely an example. For example, the fourth side surface LS14 may form an acute angle with the second side surface LS12 and form an obtuse angle with the third side surface LS13. Similarly, the eighth side surface LS24 may form an acute angle with the sixth side surface LS22 and form an obtuse angle with the seventh side surface LS23.

Figure 8:
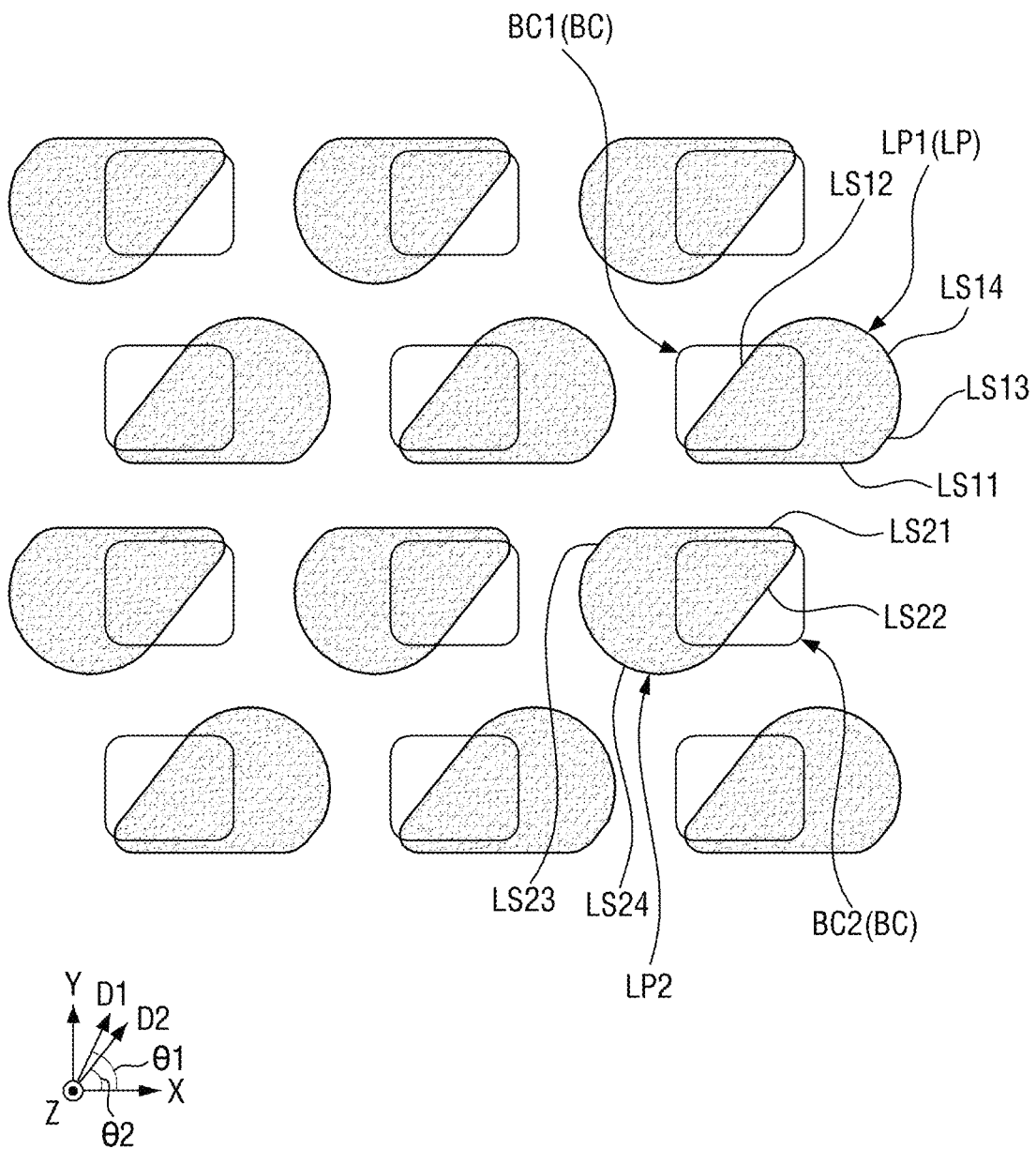

Referring to FIG. 8, in the semiconductor memory device according to some embodiments, the first to third side surfaces LS11, LS12, and LS13 of the first landing pad LP1 are connected to each other by curved surfaces, and the fifth to seventh side surfaces LS21, LS22, and LS23 of the second landing pad LP2 are connected to each other by curved surfaces.

For example, the first and second landing pads LP1 and LP2 of FIG. 8 may have shapes obtained by removing the cusps from the first and second landing pads LP1 and LP2 of FIG. 6. In this case, it may be possible to prevent a short circuit caused by the landing pad LP being connected to another pattern (e.g., another landing pad LP or buried contact BC connected to another landing pad LP) adjacent thereto. The landing pads LP from which the cusps are removed may be formed, for example, through a trimming process, without being limited thereto.

Figure 9:
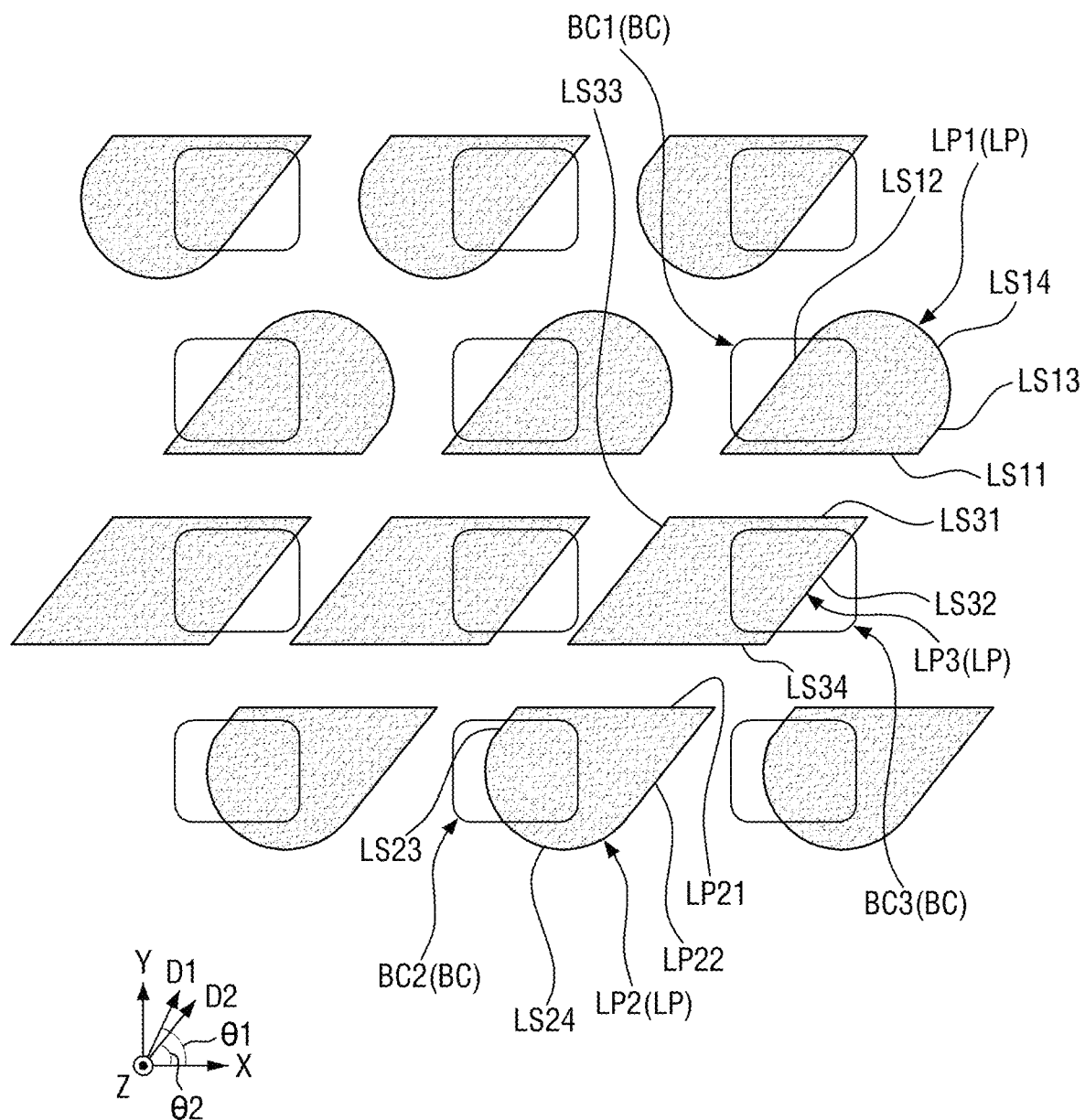

Referring to FIG. 9, in the semiconductor memory device according to some embodiments, the plurality of landing pads LP may further include a third landing pad LP3.

For example, the plurality of buried contacts BC may further include a third buried contact BC3 adjacent to the first buried contact BC1. The first and third buried contacts BC1 and BC3 may be arranged along the second direction Y. In some embodiments, the second and third buried contacts BC2 and BC3 may be arranged along a diagonal direction.

The third landing pad LP3 may be connected to the third buried contact BC3. In some embodiments, the second landing pad LP2, the third landing pad LP3, and the first landing pad LP1 may be sequentially arranged along the fourth direction D2.

The third landing pad LP3 may include a side surface extending in the fourth direction D2 in plan view. For example, the third landing pad LP3 may include ninth to twelfth side surfaces LS31, LS32, LS33, and LS34. The ninth to twelfth side surfaces LS31, LS32, LS33, and LS34 may each form a closed loop in plan view.

The ninth side surface LS31 may face the first side surface LS11. In some embodiments, the ninth side surface LS31 may include a flat surface. For example, the ninth side surface LS31 may form a straight line in plan view. In some embodiments, the ninth side surface LS31 may be parallel to the first side surface LS11. For example, the ninth side surface LS31 may extend in the first direction X.

The tenth side surface LS32 may extend from the ninth side surface LS31 in the fourth direction D2. In some embodiments, the tenth side surface LS32 may form the second acute angle θ2 with the ninth side surface LS31. In some embodiments, the ninth side surface LS31 may be coplanar with the third side surface LS13 and the sixth side surface LS22. That is, one plane including all of the third side surface LS13, the sixth side surface LS22, and the ninth side surface LS31 may exist.

The eleventh side surface LS33 may be opposite to the tenth side surface LS32 and extend from the ninth side surface LS31. In some embodiments, the eleventh side surface LS33 may be parallel to the tenth side surface LS32. For example, the eleventh side surface LS33 may extend from the ninth side surface LS31 in the fourth direction D2. In some embodiments, the eleventh side surface LS33 may be coplanar with the second side surface LS12 and the seventh side surface LS23. That is, one plane including all of the second side surface LS12, the seventh side surface LS23, and the eleventh side surface LS33 may exist.

The twelfth side surface LS34 may face the fifth side surface LS21. In some embodiments, the twelfth side surface LS34 may include a flat surface. For example, the twelfth side surface LS34 may form a straight line in plan view. In some embodiments, the twelfth side surface LS34 may be parallel to the fifth side surface LS21. For example, the twelfth side surface LS34 may extend in the first direction X.

Figure 10:
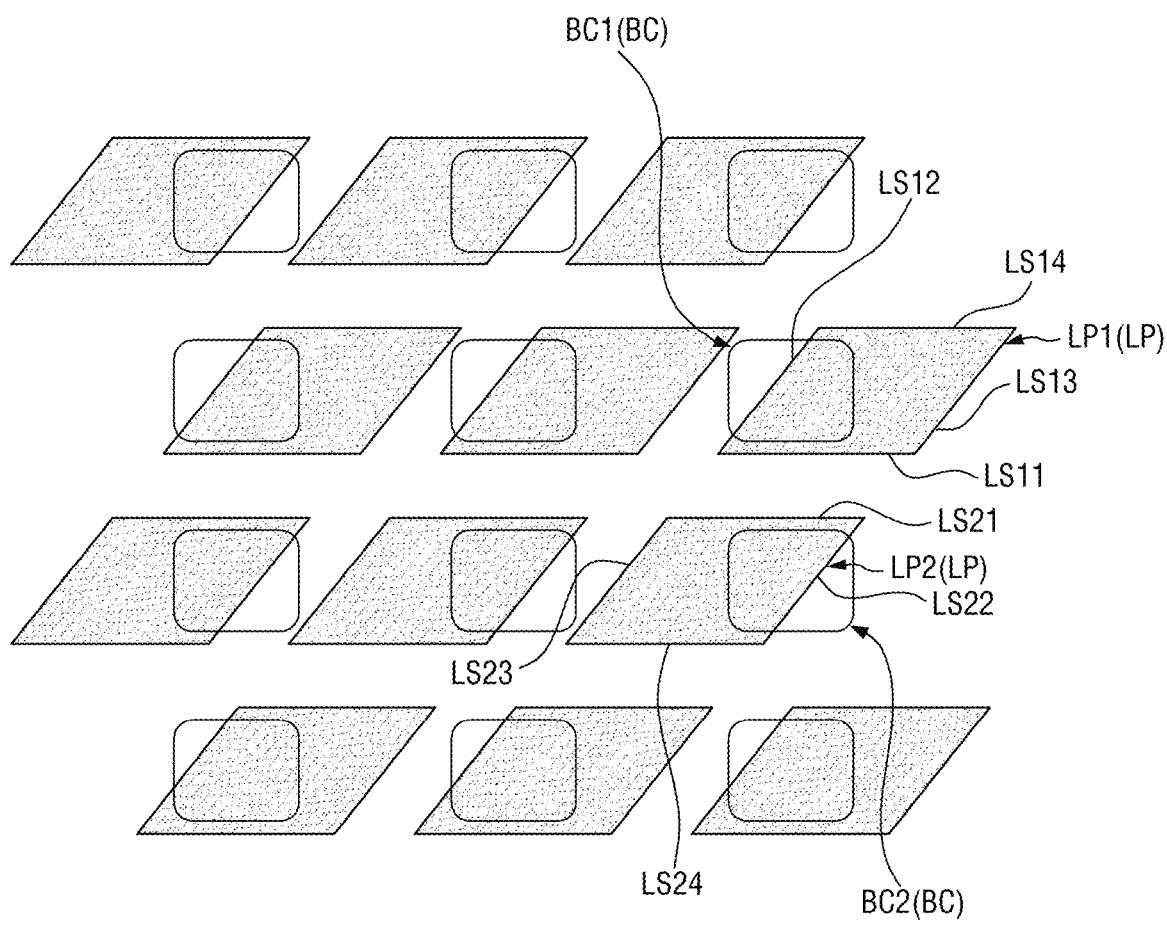

Referring to FIG. 10, in the semiconductor memory device according to some embodiments, each landing pad LP has a rhombic shape.

In some embodiments, in comparison with FIG. 6, the fourth side surface LS14 may be parallel to the first side surface LS11, and the eighth side surface LS24 may be parallel to the fifth side surface LS21. For example, the fourth and eighth side surfaces LS14 and LS24 may extend in the first direction X.

Figure 11:
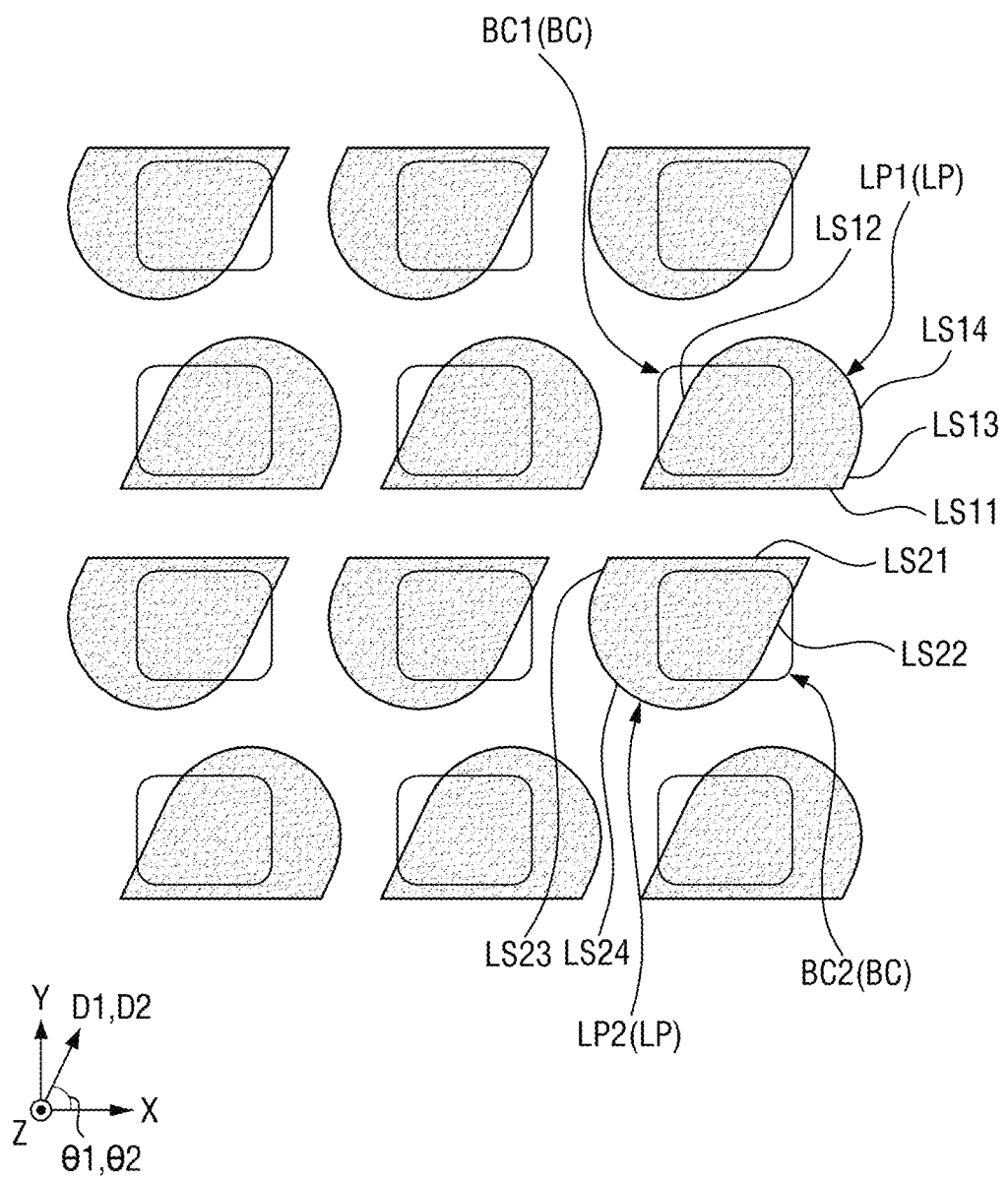

Referring to FIG. 11, in the semiconductor memory device according to some embodiments, the second acute angle θ2 may be equal to or greater than the first acute angle θ1.

That is, the fourth direction D2 may form the second acute angle θ2, which is equal to greater than the first acute angle θ1, with the first direction X. Although it is shown, for simplicity of description, that the second acute angle θ2 is equal to the first acute angle θ1, the second acute angle θ2 may be greater than the first acute angle θ1.

For example, the first and second landing pads LP1 and LP2 of FIG. 11 may have shapes with the second acute angle θ2 increased in comparison with that of the first and second landing pads LP1 and LP2 of FIG. 6. In this case, each landing pad LP may be connected to the corresponding buried contact BC through an area (e.g., overlap area between the first landing pad LP1 and the first buried contact BC1) increased in size. This may improve the connection reliability and electrical resistance between the landing pad LP and the buried contact BC.

Hereinafter, a description is made of a method for fabricating a semiconductor memory device according to some embodiments with reference to FIGS. 2 to 5 and FIGS. 12 to 25.

FIGS. 12 to 25 are views illustrating intermediate operations for explaining a method for fabricating a semiconductor memory device according to some embodiments. For simplicity of description, redundant parts of the description made with reference to FIGS. 1 to 11 may be recapitulated or omitted herein below. For reference, FIGS. 13, 15, 17, 19, 21, 23, 25 are cross-sectional views taken along lines A-A and B-B of FIGS. 12, 14, 16, 18, 20, 22, and 24, respectively.

Figure 12:
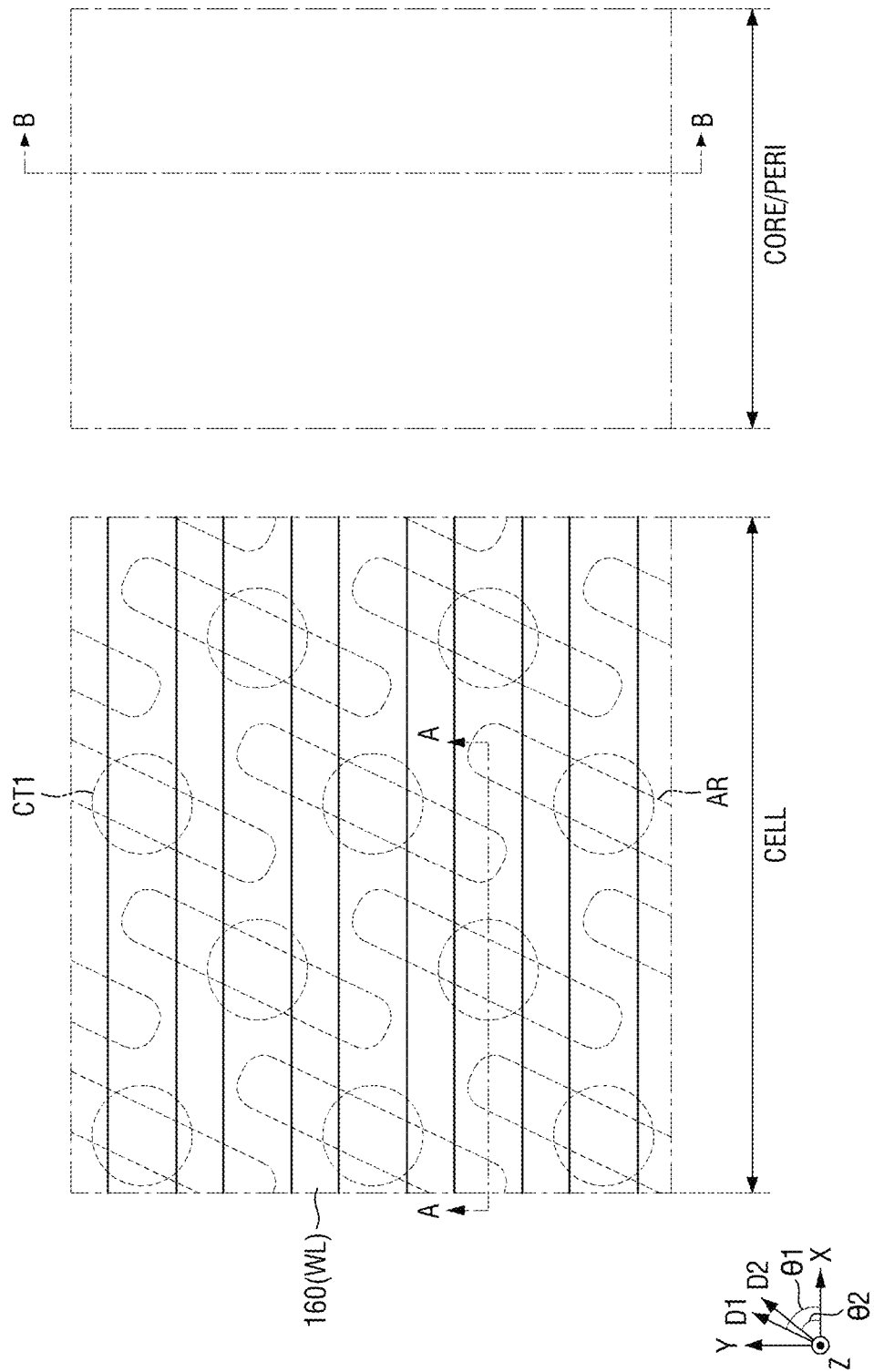
FIGS. 12 to 25 are views illustrating intermediate operations for explaining a method for fabricating a semiconductor memory device according to some embodiments.
Figure 13:
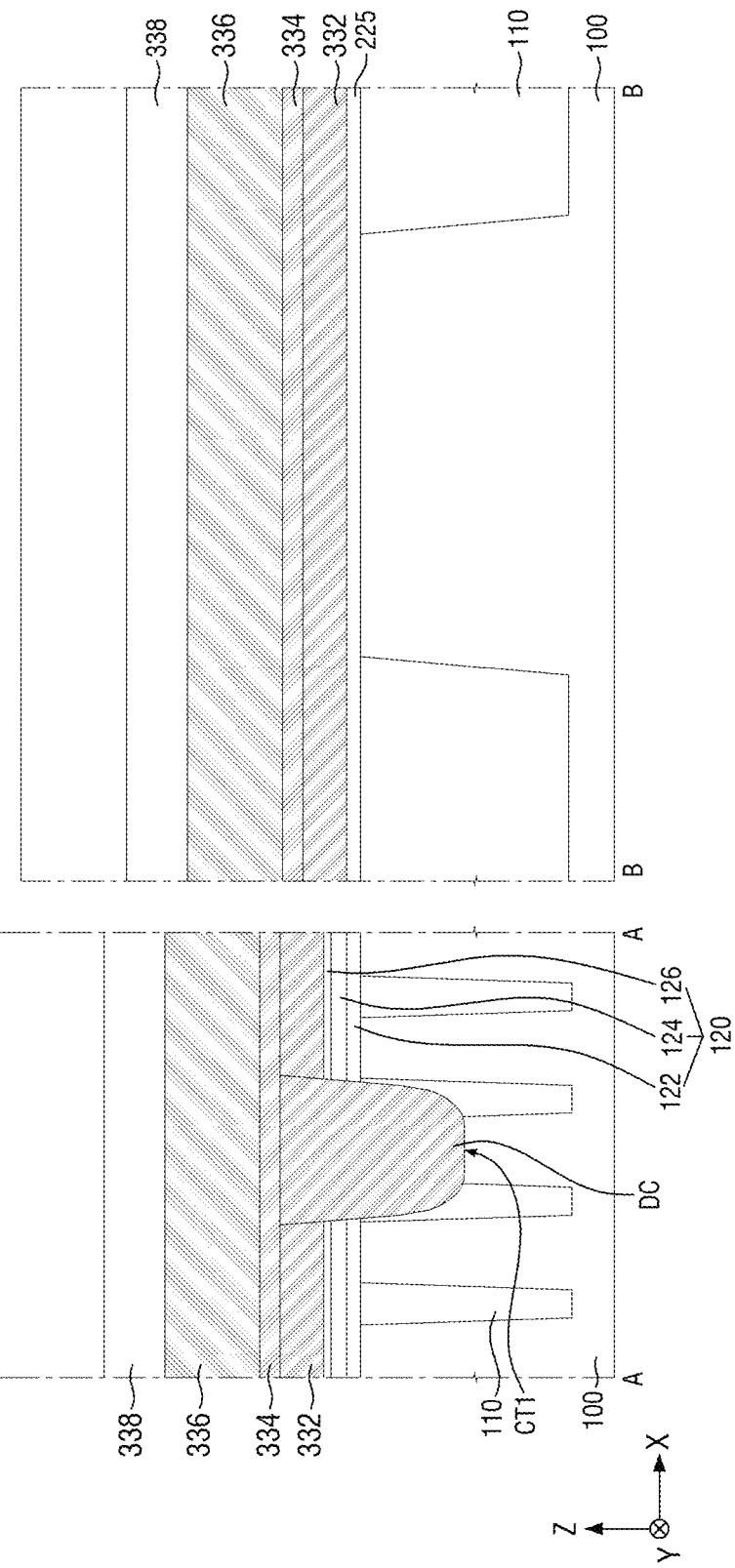

Referring to FIGS. 12 and 13, a base insulating layer 120, a first conductive layer 332, a direct contact DC, a second conductive layer 334, a third conductive layer 336, and a first capping layer 338 are formed on a substrate 100 and an element isolation layer 110.

For example, a first insulating layer 122 and the first conductive layer 332 may be sequentially formed on the substrate 100 and the element isolation layer 110. In some embodiments, a second insulating layer 124 and a third insulating layer 126 may be further formed on the first insulating layer 122 of the cell area CELL.

Then, a first contact trench CT1 exposing a part of the active region AR may be formed in the substrate 100 in the cell area CELL. In some embodiments, the first contact trench CT1 may expose the center of the active region AR. Then, the direct contact DC filling the first contact trench CT1 may be formed.

Then, the second conductive layer 334, the third conductive layer 336, and the first capping layer 338 may be sequentially formed on the first conductive layer 332 and the direct contact DC.

Figure 14:
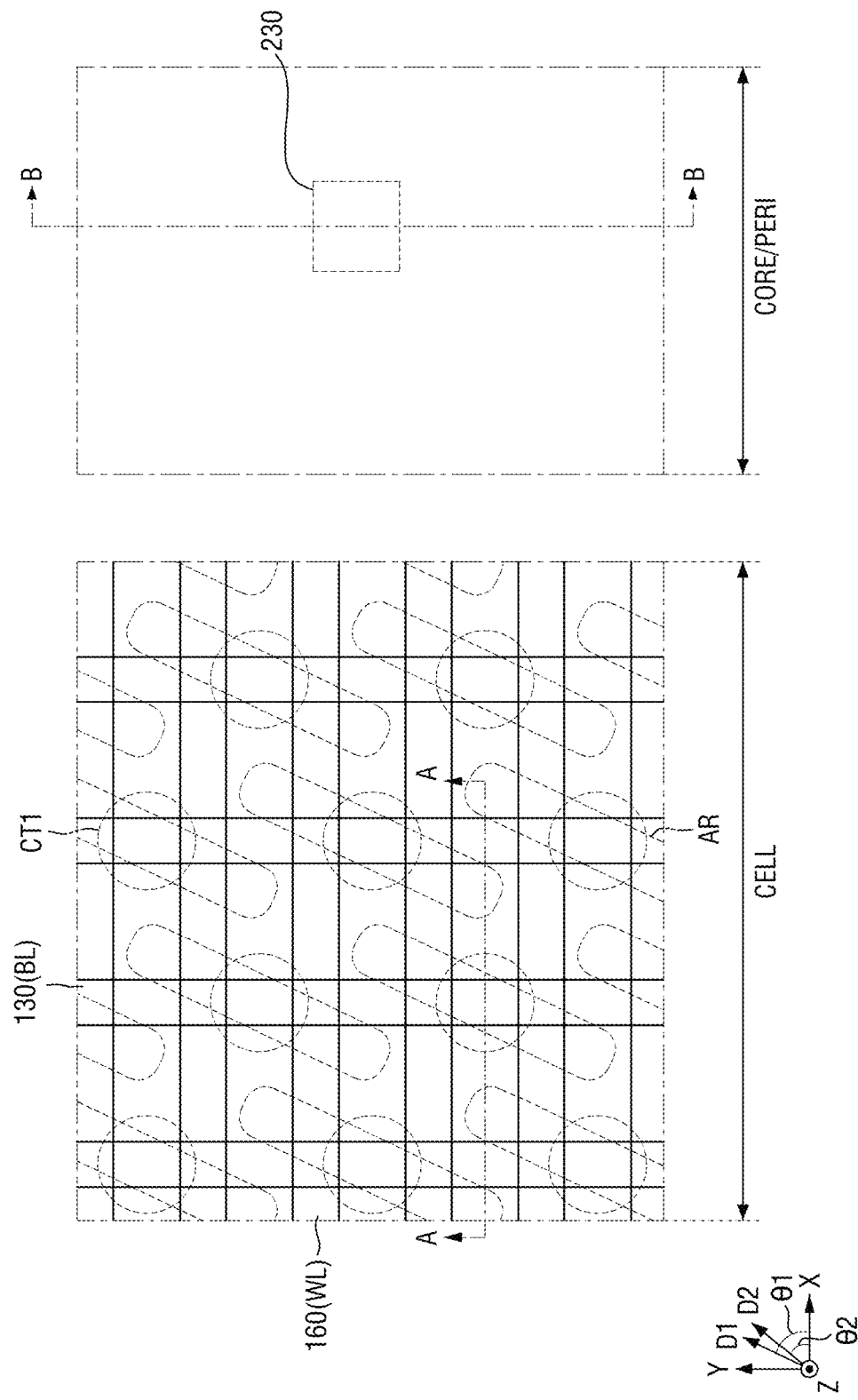
Figure 15:
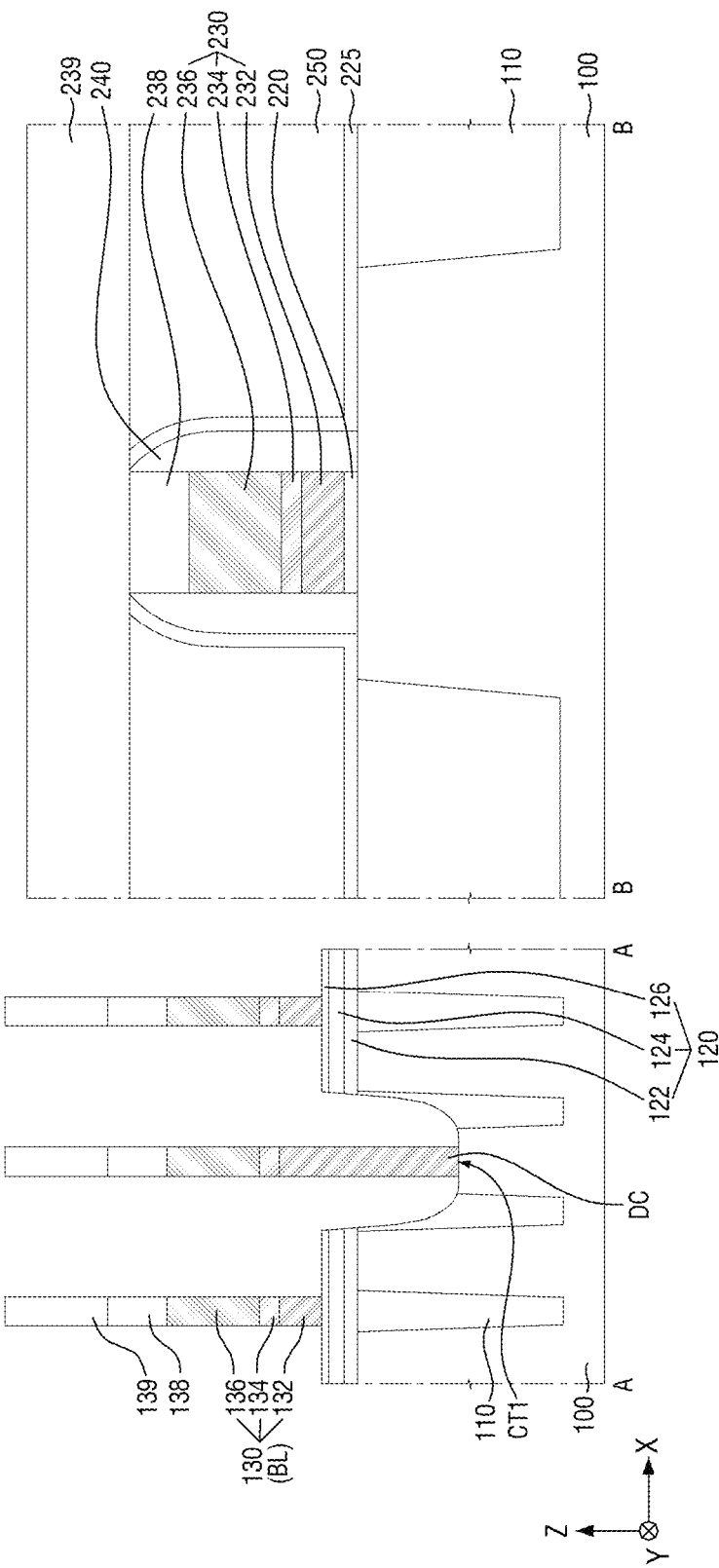

Referring to FIGS. 14 and 15, the first conductive layer 332, the direct contact DC, the second conductive layer 334, the third conductive layer 336, and the first capping layer 338 are patterned.

Accordingly, the second conductive pattern 130 (or bit line BL) and the first bit line capping pattern 138 elongated in the second direction Y may be formed on the substrate 100 in the cell area CELL.

In addition, the gate dielectric layer 220, the third conductive pattern 230, and the gate capping pattern 238 may be formed on the substrate 100 in the core/peri area CORE/PERI. In some embodiments, the gate space 240, the first liner layer 225, and the second interlayer insulating layer 250 may be further formed on the side surface of the third conductive pattern 230.

In some embodiments, the second bit line capping pattern 139 and the third interlayer insulating layer 239 may be further formed. The second bit line capping pattern 139 may extend along the top surface of the first bit line capping pattern 138. The third interlayer insulating layer 239 may extend along the top surface of the gate capping pattern 238 and the top surface of the second interlayer insulating layer 250.

Figure 16:
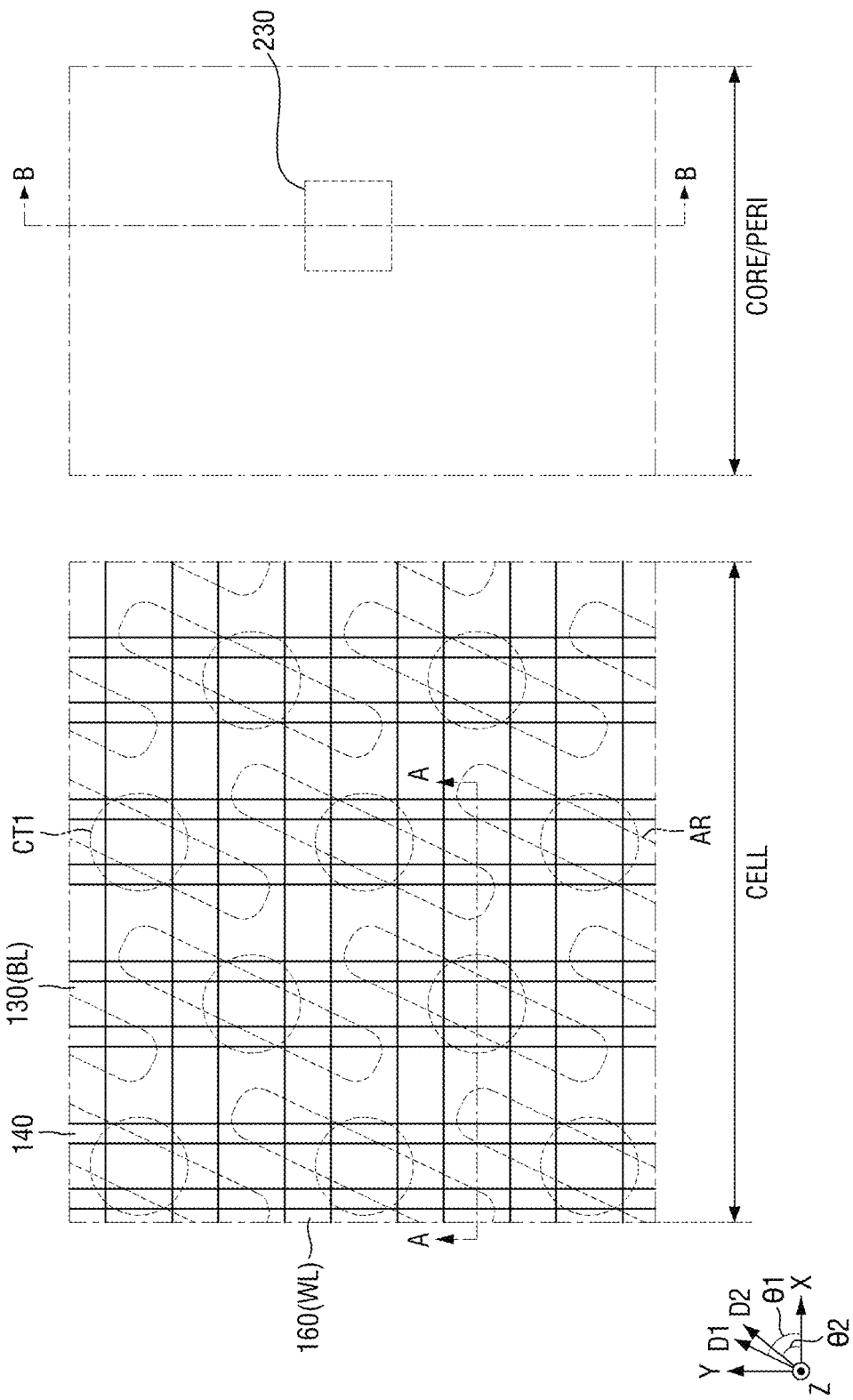
Figure 17:
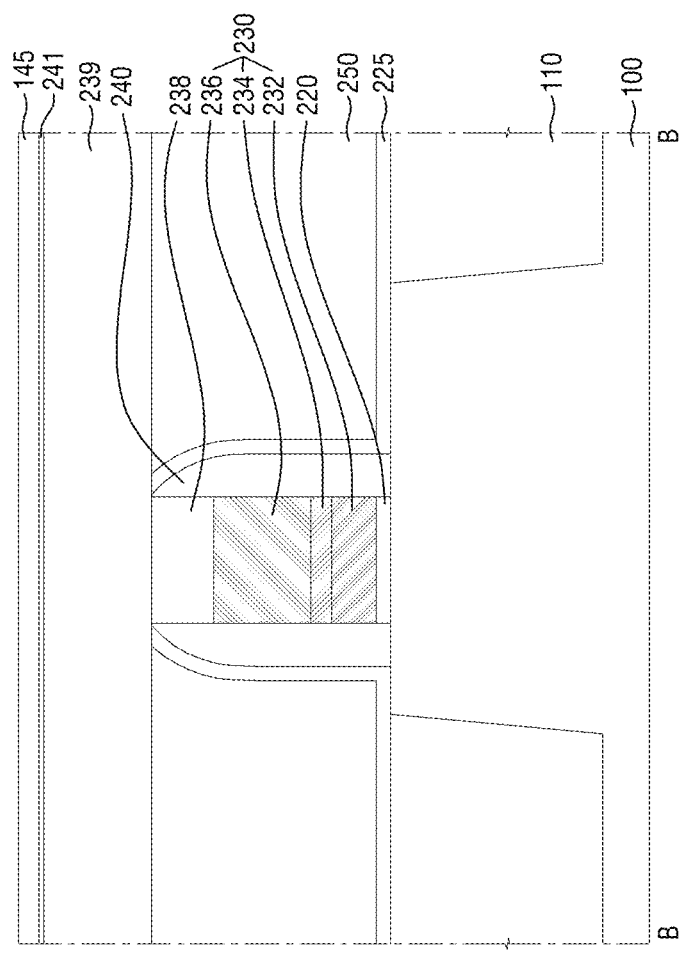
Figure 17:
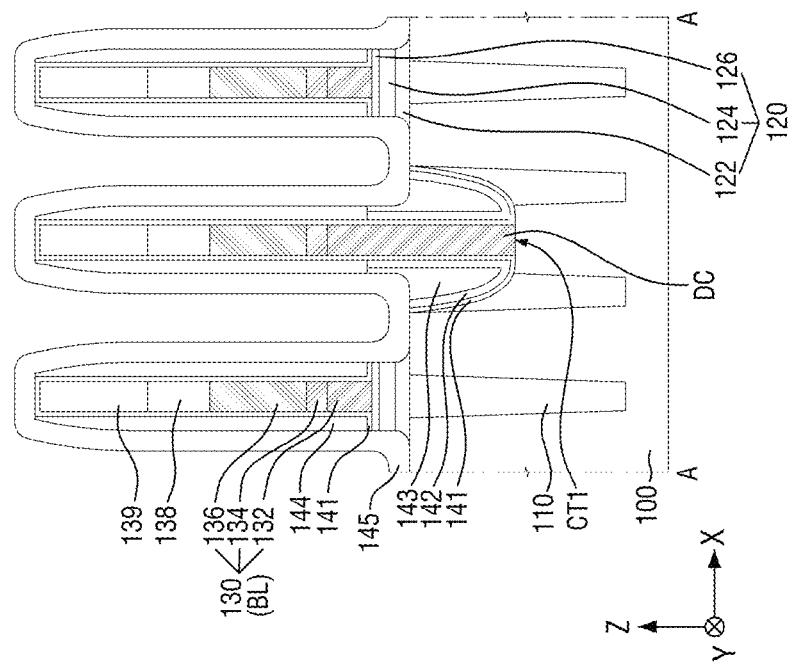

Referring to FIGS. 16 and 17, the bit line spacer 140 is formed on the side surface of the bit line BL.

For example, the bit line spacer 140 may be formed to extend along the side surface of the direct contact DC, the side surface of the second conductive pattern 130, the side surface of the first bit line capping pattern 138, the side and top surfaces of the second bit line capping pattern 139.

In some embodiments, the bit line spacer 140 may include the first spacer 141, the second spacer 142, the third spacer 143, the fourth spacer 144, and the fifth spacer 145.

In some embodiments, the second liner layer 241 may be further formed on the third interlayer insulating layer 239 in the core/peri area CORE/PERI. In some embodiments, the first spacer 141 and the second liner layer 241 may be formed at the same level.

In some embodiments, the fifth spacer 145 may extend along the top surface of the second liner layer 241.

Figure 18:
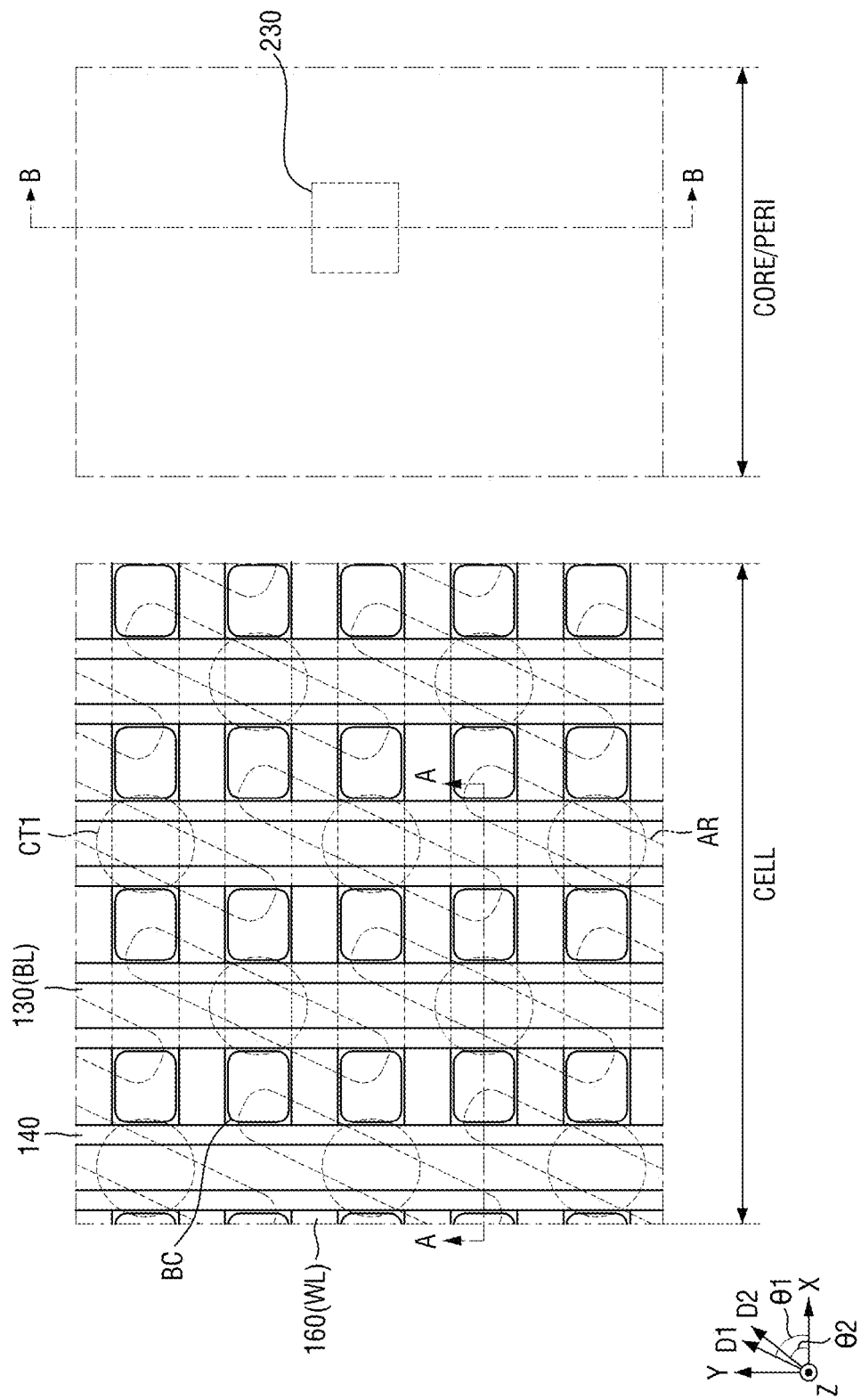
Figure 19:
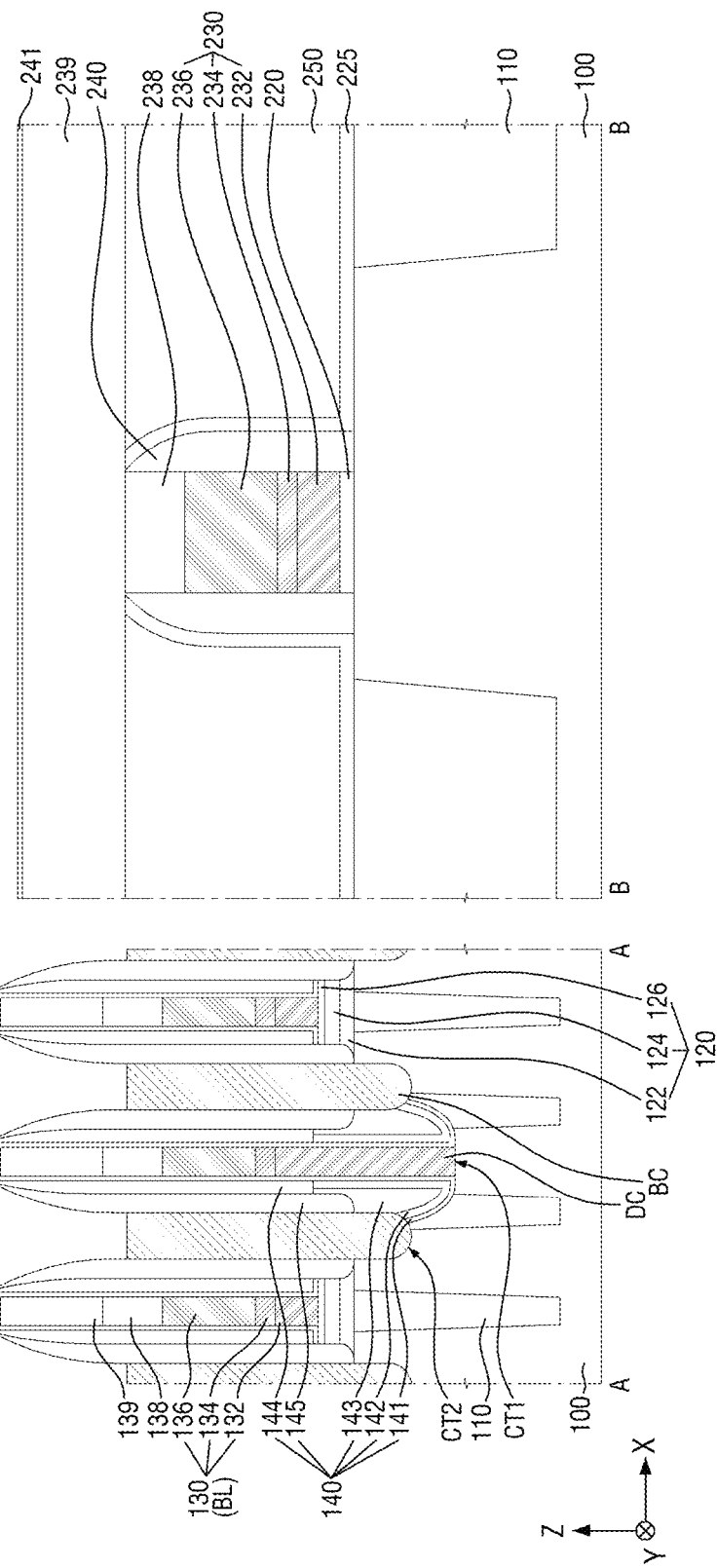

Referring to FIGS. 18 and 19, the buried contact BC is formed on the substrate 100 and the element isolation layer 110.

For example, a second contact trench CT2 exposing a part of the active region AR may be formed in the substrate 100 in the cell area CELL. In some embodiments, the second contact trench CT2 may expose both ends of the active region AR. Next, the buried contact BC filling the second contact trench CT2 may be formed.

In some embodiments, the top surface of the buried contact BC may be formed to be lower than the top surface of the second bit ling capping pattern 139. For example, the top surface of the buried contact BC may be formed to be lower than the top surface of the second bit line capping pattern 139 through an etch-back process. Accordingly, the buried contacts BC forming a plurality of isolated regions may be formed. The buried contact BC may include polysilicon, without being limited thereto.

Figure 20:
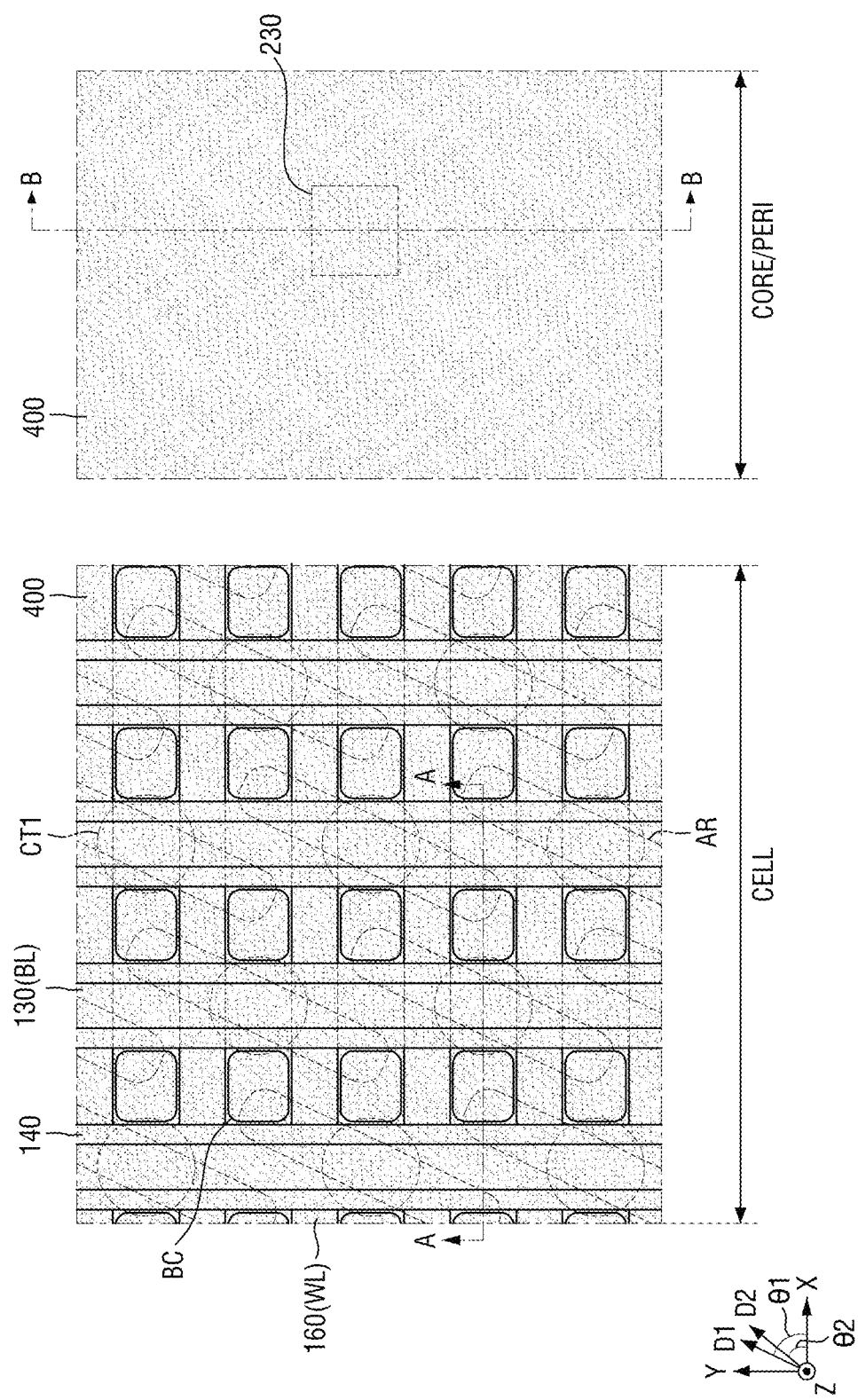
Figure 21:
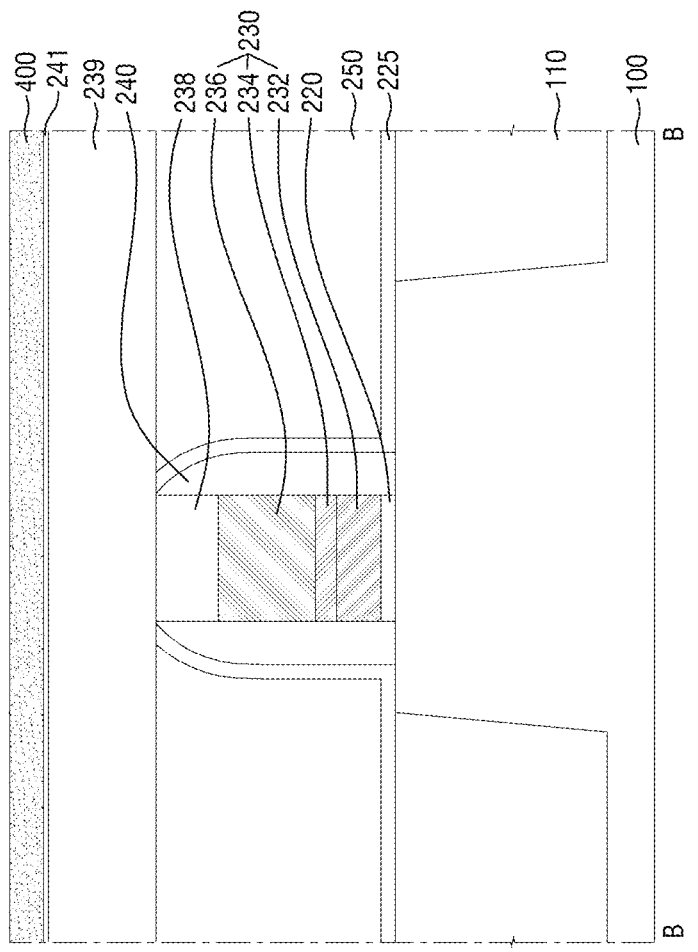
Figure 21:
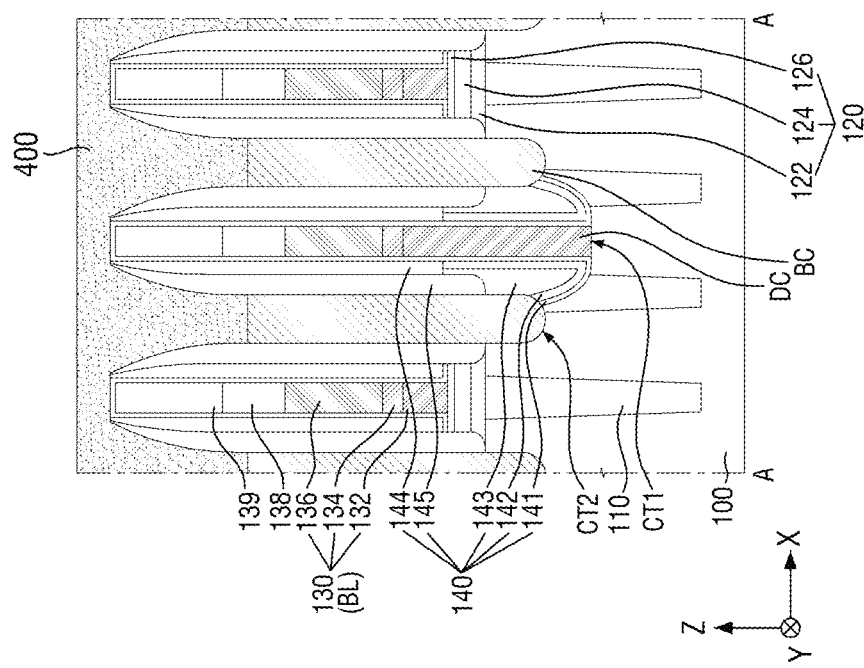

Referring to FIGS. 20 and 21, a fourth conductive layer 400 is formed on the cell area CELL and the core/peri area CORE/PERI.

For example, the fourth conductive layer 400 may be formed on the buried contact BC of the cell area CELL and the second liner layer 241 of the core/peri area CORE/PERI. The fourth conductive layer 400 may be electrically connected to the buried contact BC. The fourth conductive layer 400 may include, for example, tungsten (W), but is not limited thereto.

In some embodiments, the top surface of the fourth conductive layer 400 may be formed to be higher than the top surface of the second bit line capping pattern 139.

Figure 22:
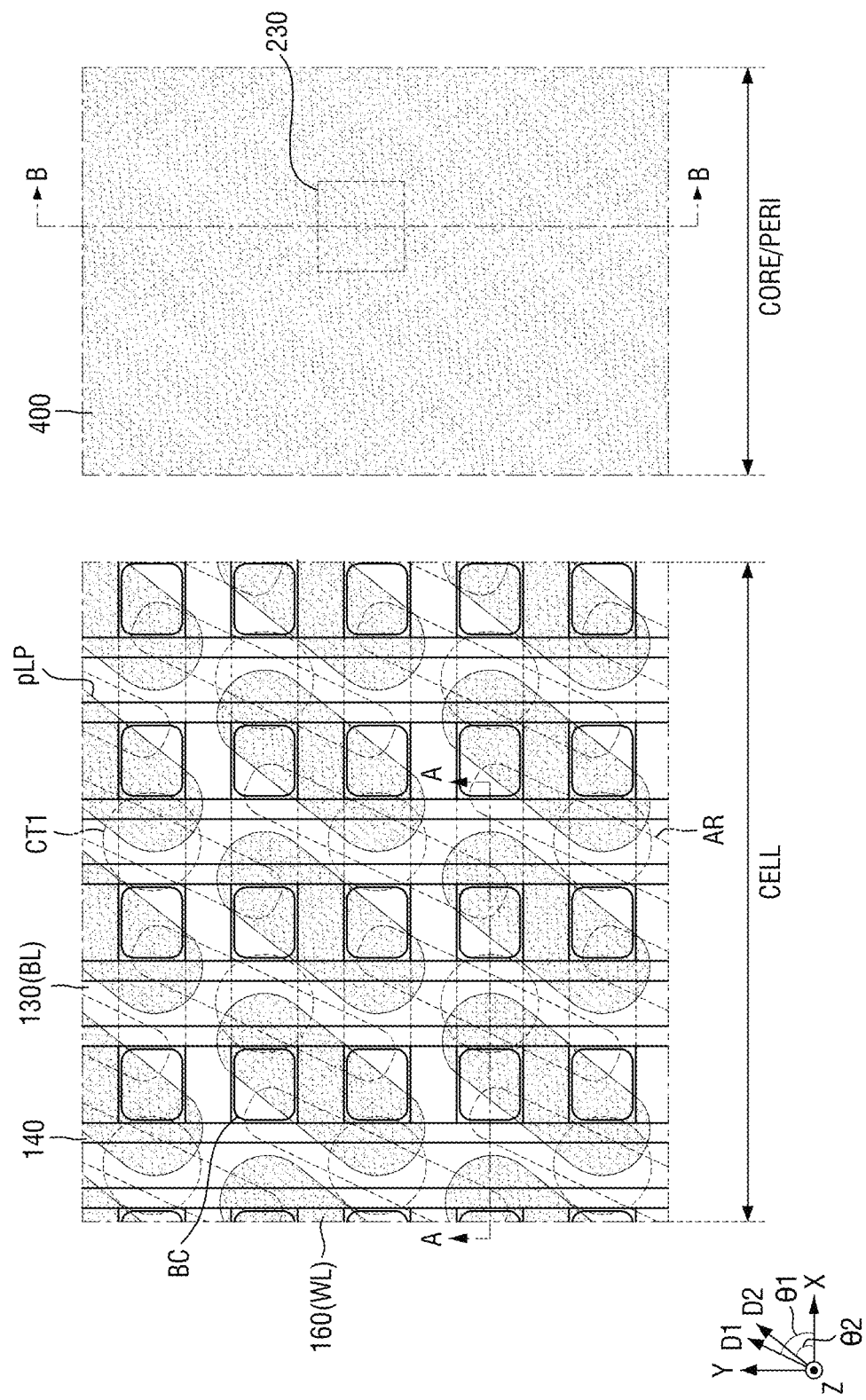
Figure 23:
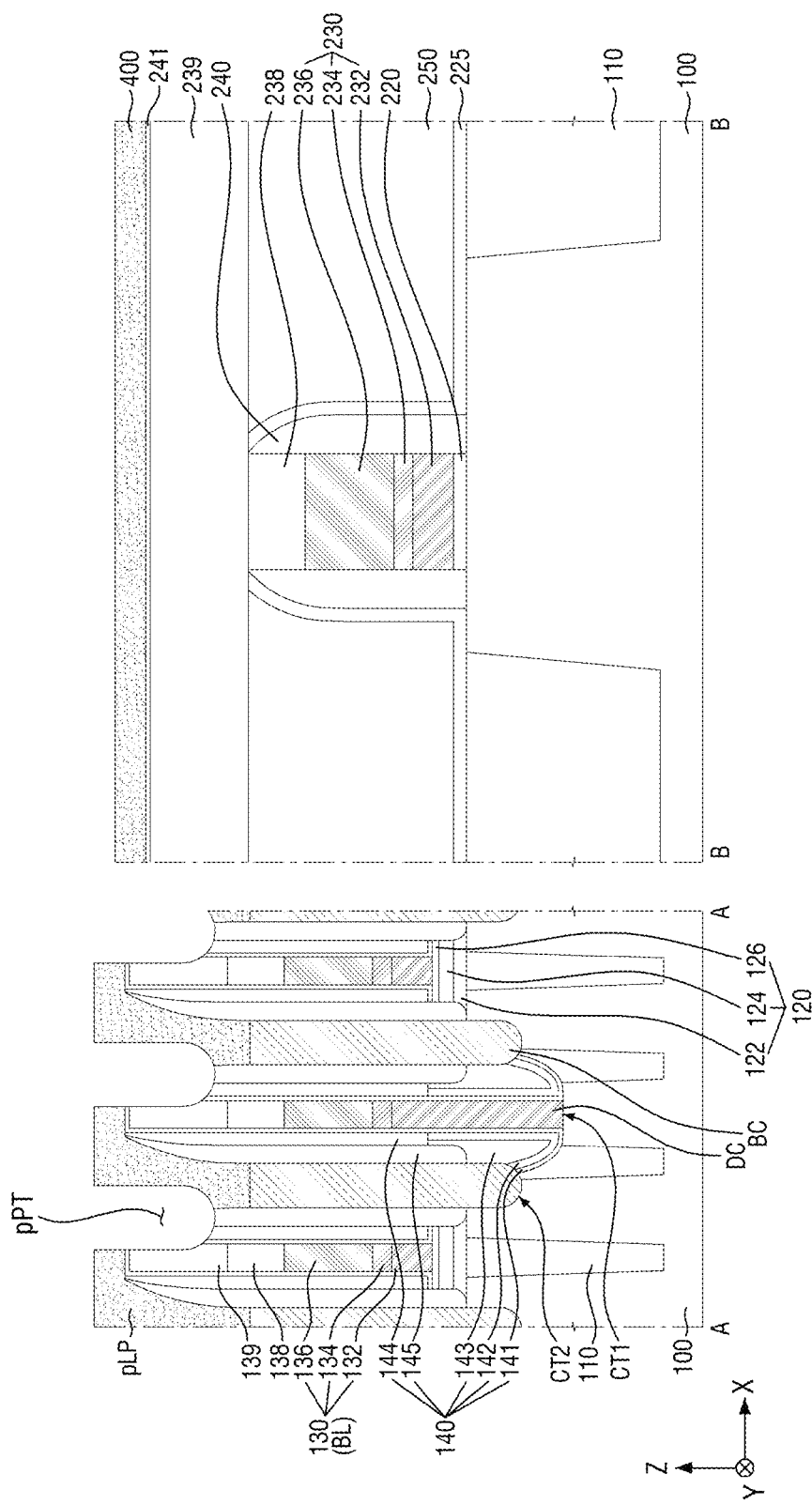

Referring to FIGS. 22 and 23, a plurality of preliminary landing pads pLP are formed by performing a first patterning process for patterning the fourth conductive layer 400 of the cell area CELL.

For example, a preliminarily pad trench pPT may be formed to define the plurality of preliminary landing pads pLP. In some embodiments, a part of the preliminary pad trench pPT may expose a part of the second bit line capping pattern 139. For example, the preliminary pad trench pPT may be formed to extend from the top surface of the preliminary landing pad pLP such that the bottom surface thereof is lower than the top surface of the second bit line capping pattern 139. Accordingly, the plurality of preliminary landing pads pLP may be separated from each other by the second bit line capping pattern 139 and the preliminary pad trench pPT.

In some embodiments, the preliminary landing pads pLP may each overlap at least two buried contacts BC among the plurality of buried contacts BC. FIG. 22 as an example shows the preliminary landing pads pLP, each overlapping two buried contacts BC. In some embodiments, the two buried contacts BC overlapping one preliminary landing pad pLP may be arranged to be adjacent to each other along the second direction Y.

In some embodiments, preliminary landing pads pLP may each extend in the fourth direction D2 different from the first direction X and the second direction Y. In some embodiments, the fourth direction D2 may form the second acute angle θ2 with the first direction X. Although it is shown in FIG. 22 that the second acute angle θ2 is smaller than the first acute angle θ1, it is merely an example. For example, the second acute angle θ2 may be equal to or greater than the first acute angle θ1. The second acute angle θ2 may be equal to or greater than 60 degrees.

Figure 24:
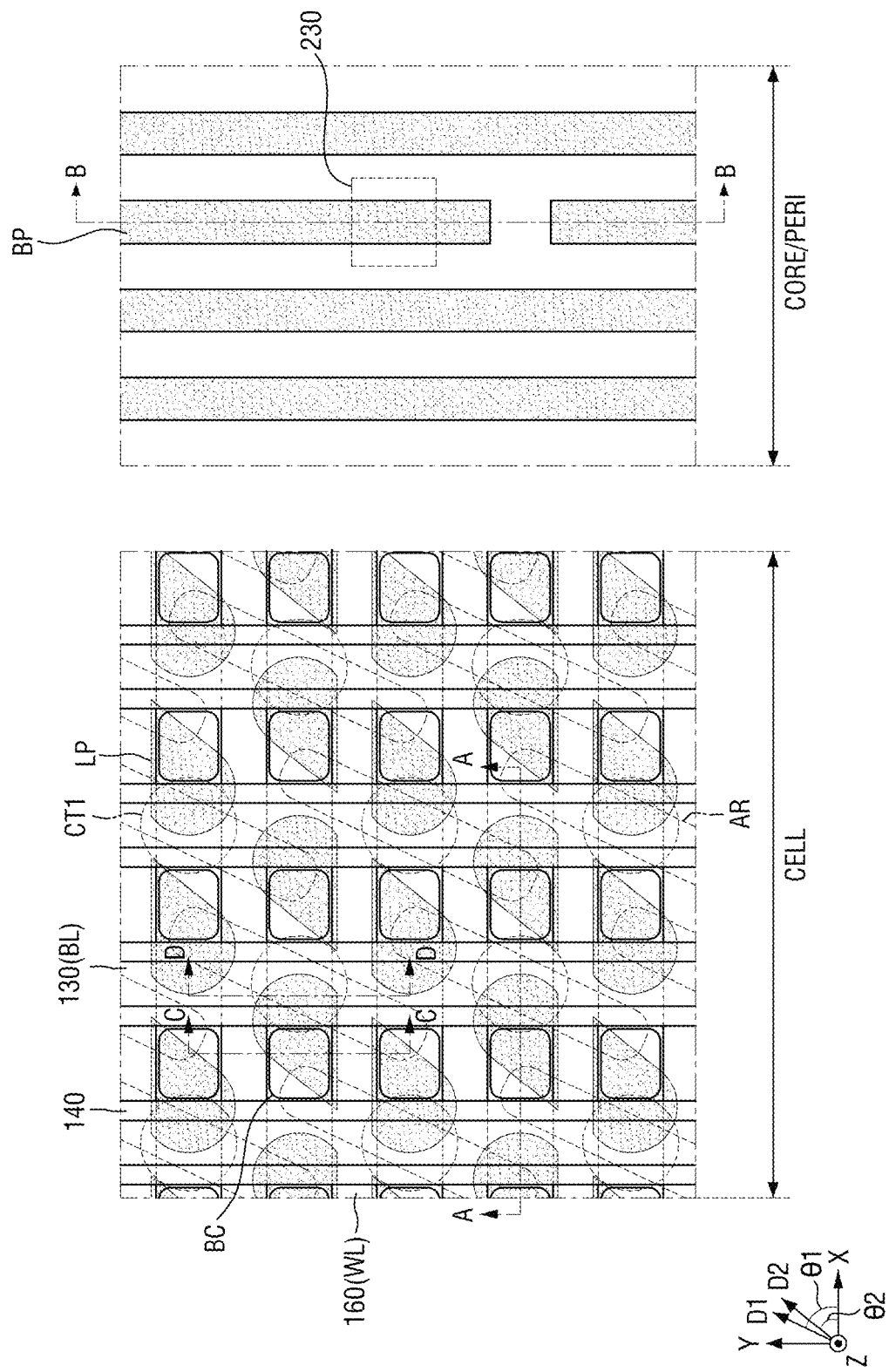
Figure 25:
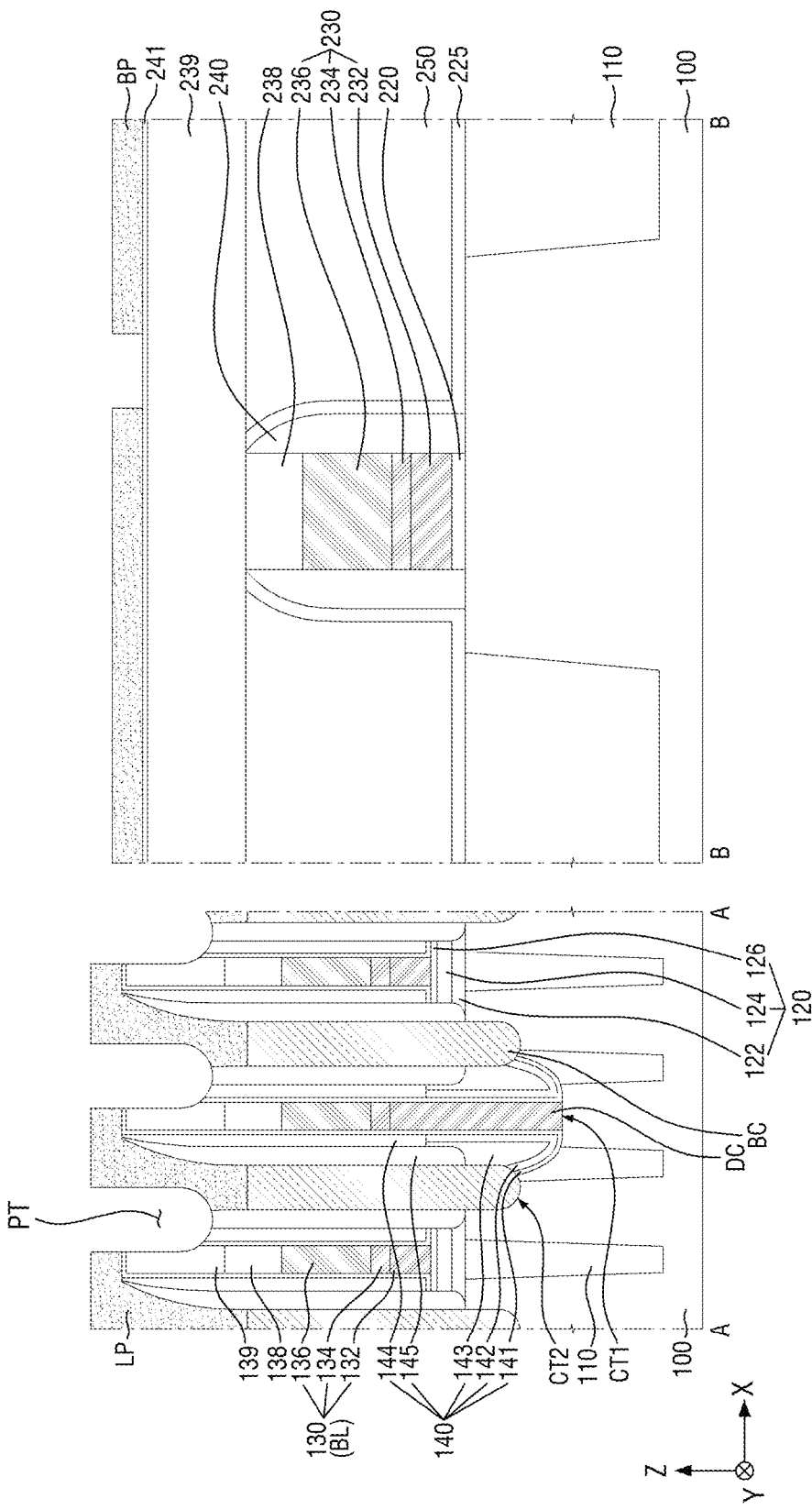

Referring to FIGS. 24 and 25, the plurality of landing pads LP are formed by performing a second patterning process for patterning the preliminary landing pads pLP.

For example, a pad trench PT may be formed to define the plurality of landing pads LP. In some embodiments, the pad trench PT may be formed by cutting the preliminary landing pads pLP using an etching mask elongated in the first direction X. In some embodiments, the etching mask may be arranged to overlap the word line WL. Accordingly, the preliminary landing pads pLP may each be divided into two landing pads LP (e.g., the first landing pad LP1 and the second landing pad LP2 in FIG. 6) arranged along the fourth direction D2.

In some embodiments, the plurality of landing pads LP of the cell area CELL may be formed simultaneously along with the formation of the wiring pattern BP of the core/peri area CORE/PERI. For example, the second patterning process may include forming the wiring pattern BP by patterning the fourth conductive layer 400 of the core/peri area CORE/PERI.

Then, referring to FIGS. 2 and 3, the first interlayer insulating layer 180 is formed on the landing pad LP.

For example, the first interlayer insulating layer 180 for filling the pad trench PT may be formed. Accordingly, the plurality of landing pads LP forming the plurality of isolated regions separated from each other by the first interlayer insulating layer 180 may be formed. In some embodiments, the first interlayer insulating layer 180 may be patterned to expose at least a part of the top surface of each landing pad LP.

Then, a lower electrode 192 connected to the landing pad LP exposed by the first interlayer insulating layer 180 may be formed. Then, a capacitor dielectric layer 194 and an upper electrode 196 may be sequentially formed on the lower electrode 192. Accordingly, a capacitor 190 connected to the landing pad LP may be formed.

Referring back to FIG. 22, in the method for fabricating a semiconductor memory device according to some embodiments, the preliminary landing pads pLP may each overlap three buried contacts BC unlike those shown in the drawing. Then, the step described with reference to FIGS. 24 and 25 may be performed. Accordingly, a semiconductor memory device including the landing pads LP described above with reference to FIG. 9 may be fabricated.

In the method for fabricating a semiconductor memory device according to some embodiments, the preliminary landing pads pLP may each be elongated in the fourth direction D2 unlike those shown in the drawing. Subsequently, the step described above with reference to FIGS. 24 and 25 may be performed. Accordingly, a semiconductor memory device including the landing pads LP described above with reference to FIG. 10 may be fabricated.

As a semiconductor memory device becomes more highly integrated, individual circuit patterns have become more miniaturized to realize more semiconductor memory devices within the same area. For example, it may be required to arrange the landing pads in a fine honeycomb structure. In order to accomplish this, it tends to increase the aspect ratio of the patterning process, but the increased aspect ratio increases process difficulty and causes defects such as pattern collapse.

However, the method for fabricating a semiconductor memory device according to some embodiments is capable of realizing a fine circuit pattern with relatively low process difficulty by performing a patterning process twice. For example, in the method for fabricating a semiconductor memory device according to some embodiments, first, a plurality of preliminary landing pads pLP may be formed (first patterning process), and then the preliminary landing pads pLP may be cut to form the plurality of landing pads LP (second patterning process). Since the preliminary landing pads pLP are larger in size than the landing pads LP to be finally formed, the preliminary landing pads pLP may be formed with relatively low process difficulty.

In addition, the preliminary landing pads pLP may each be formed to extend in the fourth direction D2 different from the first direction X and the second direction Y. Accordingly, it may be possible to form a plurality of landing pads LP arranged in a fine honeycomb structure, which allows a semiconductor memory device to be realized with a fine circuit pattern.

While some example embodiments have been described, the presented embodiments of the disclosure are to be used in a generic and descriptive sense only and not for purposes of limitation. Those skilled in the art will appreciate that many variations and modifications may be made to embodiments of inventive concepts without substantially departing from the principles of inventive concepts in the present disclosure as defined by the following claims.

What is claimed is:

1. A semiconductor memory device comprising:
a substrate including an active region extending in a third direction;
a plurality of first conductive patterns extending parallel in a first direction different from the third direction on the substrate;
a plurality of second conductive patterns extending parallel in a second direction crossing the first direction on the substrate;
a plurality of buried contacts connected to the substrate between the plurality of first conductive patterns and between the plurality of second conductive patterns;
a landing pad on and connected to each of the plurality of buried contacts; and
a capacitor connected to the landing pad, and contacting a top surface of the landing pad,
the landing pad including a first side surface extending in the first direction in plan view and a second side surface extending in a fourth direction different from the first direction, the second direction, and the third direction in plan view,
the first side surface and the second side surface are not in direct contact with the capacitor,
the first direction, the second direction, the third direction, and the fourth direction being in a same plane, and
the third direction and the fourth direction are not perpendicular.

2. The semiconductor memory device of claim 1, wherein each of the plurality of second conductive patterns is connected to the substrate.

3. The semiconductor memory device of claim 2, further comprising:
a base insulating layer extending along a top surface of the substrate; and
a direct contact penetrating the base insulating layer and being connected to each of the plurality of second conductive patterns and the substrate,
wherein each of the first conductive patterns is in the substrate between the direct contact and each of the buried contacts.

4. The semiconductor memory device of claim 3, wherein a top surface of each of the plurality of first conductive patterns is lower than the top surface of the substrate.

5. The semiconductor memory device of claim 1, wherein the landing pad further includes a third side surface parallel to the second side surface.

6. The semiconductor memory device of claim 5, wherein the landing pad further includes a fourth side surface that is convex and connects the second side surface to the third side surface.

7. The semiconductor memory device of claim 5, wherein the landing pad further includes a fourth side surface that is parallel to the first side surface and connects the second side surface to the third side surface.

8. The semiconductor memory device of claim 1, wherein the first side surface and the second side surface form an acute angle that is equal to or greater than 60 degrees.

9. A semiconductor memory device comprising:
a substrate including an active region extending in a third direction;
a first conductive pattern extending in a first direction different from the third direction on the substrate;

a second conductive pattern on the substrate, the second conductive pattern extending in a second direction crossing the first direction and connects to the substrate;

a first buried contact on the substrate at one side of the first conductive pattern, the first buried contact being connected to the substrate;

a second buried contact on the substrate at an other side of the first conductive pattern, the second buried contact being connected to the substrate;

a first landing pad connected to the first buried contact, the first landing pad including a first side surface extending in a fourth direction which extends an acute angle with the first direction in plan view, the first side surface of the first landing pad and the first direction being in a same plane parallel to an upper surface of the substrate;

a second landing pad connected to the second buried contact, the second landing pad including a second side surface that is coplanar with the first side surface; and capacitors respectively connected to the first landing pad and the second landing pad, and contacting a top surface of the first landing pad and a top surface of the second landing pad, respectively, wherein the first direction, the second direction, the third direction, and the fourth direction being in a same plane, wherein the third direction and the fourth direction are not perpendicular, and wherein the first side surface and the second side surface are not in direct contact with the capacitors.

10. The semiconductor memory device of claim 9, wherein the first landing pad further includes a third side surface extending in the first direction from the first side surface, the second landing pad further includes a fourth side surface extending in the first direction from the second side surface, and the fourth side surface and the third side surface are opposite to each other.

11. The semiconductor memory device of claim 10, wherein the first landing pad further includes a fifth side surface that forms an obtuse angle with the third side surface in plan view, and the second landing pad further includes a sixth side surface that is coplanar with the fifth side surface.

12. The semiconductor memory device of claim 11, wherein the first side surface and the fifth side surface are parallel to each other, and the second side surface and the sixth side surface are parallel to each other.

13. The semiconductor memory device of claim 9, wherein the first side surface forms an acute angle, which is equal to or greater than 60 degrees, with the first direction.

14. The semiconductor memory device of claim 9, wherein the first buried contact and the second buried contact are arranged along a second direction perpendicular to the first direction.

15. The semiconductor memory device of claim 14, further comprising:

a second conductive pattern on the substrate, wherein the second conductive pattern extends in the second direction and connects to the substrate, and the first buried contact and the second buried contact are disposed at one side of the second conductive pattern.

16. A semiconductor memory device comprising:

a substrate;

an element isolation layer on the substrate and defining a plurality of active regions in the substrate, wherein each of active regions extends in a third direction;

a word line extending in a first direction crossing each of the plurality of active regions in the substrate;

a bit line on the substrate, the bit line being connected to each of the plurality of active regions, and the bit line extending in a second direction crossing the first direction;

a plurality of buried contacts on a side surface of the bit line, the plurality of buried contacts being respectively connected to the plurality of active regions;

a plurality of landing pads on the plurality of buried contacts, the plurality of landing pads being respectively connected to the buried contacts, the plurality of landing pads being arranged in a honeycomb structure, each of the plurality of landing pads including a first side surface extending in the first direction in plan view and a second side surface extending in a fourth direction different from the first direction, the second direction, and the third direction in plan view, and the first direction, the second direction, the third direction, and the fourth direction being in a same plane;

a plurality of capacitors respectively connected to the plurality of landing pads, and contacting a top surface of each of the plurality of landing pads, wherein the third direction and the fourth direction are not perpendicular, and wherein the first side surface and the second side surface are not in direct contact with the capacitors.

17. The semiconductor memory device of claim 16, wherein the plurality of buried contacts are arranged in a lattice structure.

18. The semiconductor memory device of claim 16, further comprising:

a base insulating layer extending along a top surface of the substrate and a top surface of the element isolation layer; and a direct contact penetrating the base insulating layer to connect the bit line to each of the plurality of active regions.

19. The semiconductor memory device of claim 18, wherein the word line is between the direct contact and each of the plurality of buried contacts.

* * * * *